United States Patent [19]
Blalock et al.

[11] Patent Number: 5,703,353
[45] Date of Patent: Dec. 30, 1997

[54] OFFSET REMOVAL AND SPATIAL FREQUENCY BAND FILTERING CIRCUITRY FOR PHOTORECEIVER SIGNALS

[75] Inventors: Travis N. Blalock, Santa Clara; Richard A. Baumgartner, Palo Alto; Thomas Hornak, Portola Valley; David Beard, Palo Alto, all of Calif.

[73] Assignee: Hewlett-Packard Company, Palo Alto, Calif.

[21] Appl. No.: 591,076

[22] Filed: Jan. 25, 1996

[51] Int. Cl.$^6$ ............................................. H01J 40/14
[52] U.S. Cl. ........................ 250/214 C; 250/214 A; 250/214 R; 327/307
[58] Field of Search ............ 250/208.1, 214 C, 250/214 R, 214 A; 327/307, 551, 552; 348/241, 250, 300

[56] References Cited

U.S. PATENT DOCUMENTS

| 4,488,052 | 12/1984 | Zappen et al. | 250/208.1 |
| 5,149,980 | 9/1992 | Ertel et al. | 250/561 |
| 5,321,254 | 6/1994 | Yokogawa et al. | 250/214 R |

OTHER PUBLICATIONS

C. A. Waton, "Drift Elimination Circuit for Differential Amplifiers", IBM Technical Disclosure Bulletin, Sep. 1969, vol. 12, No. 4, p. 549.

*Primary Examiner*—Edward P. Westin
*Assistant Examiner*—Kevin Pyo

[57] ABSTRACT

Circuitry and method for transferring signals from a photoreceiver array to computational circuitry includes parallel transfer amplifiers that receive periodic offset correction and includes DC removal amplifiers. In a first embodiment, each transfer amplifier has a differential circuit that can be switched from a reset mode to a readout mode. In the readout mode, the voltage state at the output is responsive to first and second inputs, with the second input being connected to a source of a reference voltage. In the reset mode, the inputs are both connected to the reference voltage and the output is temporarily connected to a source of a fixed reset voltage. An offset adjustment signal is generated in response to detection of a voltage difference between the reset voltage and the actual voltage state at the output after the output has been disconnected from the source of the reset voltage. A single offset circuit is used to periodically and sequentially refresh the various transfer amplifiers. In a second embodiment, spatial frequency components at both low and high frequencies are removed from the outputs of the photoreceiver array by DC removal amplifiers. Each DC removal amplifier is assigned to a particular photoelement in the array, but receives outputs from one or more other photoelements in the array. The output of the amplifier is responsive to the differences between the analog signals input to the amplifier.

11 Claims, 14 Drawing Sheets

| MODE {CFIG1,CFIG0} | TRANSFER CHARACTERISTIC |
|---|---|
| NODCR {00} | WDATA = INP |
| TST {01} | WDATA = DCRCM · $\dfrac{gm_y}{gm_x}$ [2·TC−(TL+TR)] |
| F1 {10} | WDATA = DCRCM · $\dfrac{gm_y}{gm_x}$ [2·PHR(i)−2 PHR(i−2)] |
| F2 {11} | WDATA = DCRCM · $\dfrac{gm_y}{gm_x}$ [2·PHR(i)−(PHR(i+2)+PHR(i−2))] |

FIG. 15

OFFSET REMOVAL AND SPATIAL FREQUENCY BAND FILTERING CIRCUITRY FOR PHOTORECEIVER SIGNALS

TECHNICAL FIELD

The present invention relates generally to signal transfer circuitry and more particularly to circuitry for transferring individual signals from an array of photoreceivers to computational circuitry.

BACKGROUND ART

An accurate determination of the path of a device across a surface is important in a variety of applications. For example, if a faithful representation of an image of a scanned original is to be acquired, there must be accurate information as to the travel of the scanning device along the original. Typically, the captured image provided by a scanner is a pixel data array that is stored in memory in a digital format. A distortion-free image requires a faithful mapping of the original image to the pixel data array.

U.S. Pat. No. 5,149,980 to Ertel et at., which is assigned to the assignee of the present invention, describes use of a cross-correlation function to determine the relative movement between an original and an array of photoelements in a given direction. The patent notes that the one-dimensional approach can be extended to determine the vector of two-dimensional relative movement between the original and the array, so as to track translation, rotation and scaling in a two-dimensional plane.

The patent to Ertel et at. describes use of an optical sensor array to collect some form of "signature" of an original. The signature may be provided by illuminating and imaging the surface texture or other optical characteristics of the original. The light intensity will vary on a pixel-by-pixel basis with variations in surface texture. By cross-correlating images of the surface of the original, relative movement between the array and the original can be ascertained.

A critical element of the design of a system such as the one described by Ertel et al. is the circuitry which maintains the signal-to-noise ratio of each photoelement at a sufficiently high level to reliably determine the signature of the original. If the signal is the difference in reflectivity from pixel to pixel as a result of slight variations in paper texture of a white paper, the variations in reflectivity may be approximately six percent. If the sample rate objectives and the amount of possible subsequent signal averaging are considered, then noise terms in the signal must be less than the six percent paper reflectivity variation signal if useful information is to be obtained.

Thus, noise is one concern in the processing of signals from photoelements in a photoreceiver array. Another concern is manufacturing-induced variations in the performance of processing circuitry. Operations that rely upon computations of the differences in reflectivity from one pixel to another pixel are susceptible to error if electrically parallel transfer circuits vary in performance. In the ideal, there are no pixel-to-pixel signal differences due to variations in signal transfer circuit performance, so that differences between pixel signals are solely attributable to differences in light reception at the photoelements. However, circuit devices vary in performance, even when the devices are formed by the same fabrication process.

Yet another concern involves reliably obtaining useful information regarding an imaged surface when there are image-affecting considerations that are consistent among pixels in one neighborhood of pixels, but different among pixel neighborhoods. For example, illumination optics may create consistent neighborhood-to-neighborhood variations in the illumination of the surface to be imaged. Non-uniform illumination will cause artifacts. Another example of a consistent localized pattern is one in which a portion of the photoelement array is directed at a surface area having a dark background, while the remainder of the photoelements are directed at an unshaded area of the surface.

What is needed is transfer circuitry for connection to a photoreceiver arrangement, with the circuitry having a reduced susceptibility to errors caused by manufacturing-induced variations of devices and by multiple-pixel patterns of photoelement signal generation and/or processing.

SUMMARY OF THE INVENTION

Circuitry and a method for transferring signals from a photoelement array to computational circuits include parallel transfer amplifiers that receive periodic offset correction to reduce the susceptibility of signal processing to differences in performance among the transfer amplifiers. In another embodiment, the circuitry for transferring signals includes spatial frequency band filtering amplifiers to suppress the effects of such artifacts as multi-photoelement patterns of light reception at the photoelement array.

In the following disclosure, the term "DC removal" will be used as a shorthand term to denote spatial frequency band filtering. It is to be understood that the term "DC removal," as used herein, encompasses not only the removal of DC spatial components, but also the removal of spatial frequency components at either or both low and high frequencies.

At the transfer amplifier level, when in a readout mode, each transfer amplifier has a first input that is connected to receive a signal indicative of light received at a photoelement. The photoelements in the array may be arranged in columns and rows, with the photoelements in a particular column being sequentially connected to the first input of a particular transfer amplifier, but this is not critical. Each transfer amplifier has a second input connected to a source of a reference voltage (e.g., 1.75 volts). The transfer amplifiers operate as differential circuits, so that an output is responsive to the difference between the voltage states at the first and second inputs. However, during a reset interval between readout intervals, both of the first and second inputs are connected to the source of the reference voltage. Moreover, the output of a transfer amplifier is momentarily connected to a source of a reset voltage (e.g., 3.25 volts). An offset reduction circuit is provided to generate an offset adjustment signal in response to detecting a voltage difference between the reset voltage and the voltage state at the output after the output has been disconnected from the source of the reset voltage. In this manner, the adjustment signal may be applied to the transfer amplifier of interest to reduce or eliminate any difference in performance between the transfer amplifier and other transfer amplifiers.

An advantage of the offset-adjusted transfer amplifier embodiment is that the influence of device-to-device variations and 1/f noise is taken into account. The cycle time for reading out an entire array may be in the order of 50 μs. Since CMOS circuitry is preferred, in order to achieve low power operation with a high circuit density, 1/f noise would potentially cause significant fluctuations in the outputs of the amplifiers, if such noise were not suppressed. Another advantage of the invention is that each transfer amplifier preferably includes a sample-and-hold arrangement to store the offset adjustment signal, so that each transfer amplifier only needs to be periodically refreshed. Thus, a single circuit for determining offset adjustment signals may be used for all of the transfer amplifiers. A timing sequence is provided to achieve periodic refreshes without lengthening intervals between photoelement signal readouts.

Since each transfer amplifier includes the sample-and-hold arrangement, the transfer amplifiers have three modes of operation. In a readout mode, the second input is connected to the source of the reference voltage, while the first input is connected to a photoelement. As a result, a charge will be transferred to an operatively associated integration capacitor. The amplifier output voltage is in turn supplied to downstream processing circuitry. The internal sample-and-hold arrangement will provide offset correction. A second mode of operation is a passive reset mode. The reset is "passive" because the offset adjustment signal is not updated. The passive reset mode may be of poor quality until the first active offset adjustment operation has been executed. In the passive reset mode, the two inputs of the transfer amplifier are connected together and the output remains connected to the source of the reset voltage. The third mode of operation is the active reset mode. Like the passive reset mode, the two inputs of a transfer amplifier are connected to the source of the reference voltage. However, the output is only momentarily connected to the source of the reset voltage. Once disconnected, the output is connected to the offset adjustment circuit, which determines the appropriate offset adjustment signal to be stored by the sample-and-hold arrangement until the next active reset operation.

Between the periodic updates of the offset adjustment signal, each transfer amplifier alternates between the readout mode and the passive reset mode. The 1/f offset drift components are sufficiently slow, so that an update after each eighth readout of the photoelement array is an adequate rate.

As previously noted, the invention also includes DC removal amplifiers to suppress multi-photoelement light patterns and other artifacts. The DC removal amplifiers remove spatial frequency components at both low and high frequencies from the outputs of the transfer amplifiers. There may be a one-to-one correspondence of DC removal amplifiers to transfer amplifiers. Each DC removal amplifier includes a primary input that is connected to receive a signal of interest from a particular photoelement. Each DC removal amplifier also includes at least one secondary input connected to receive an output signal from a photoelement proximal to the particular photoelement. In effect, an averaging of the secondary inputs occurs and the resulting average value is subtracted from the primary input. The DC removal amplifiers, in addition to removing low spatial frequency components, also have an inherent low-pass characteristic at a frequency corresponding to twice the pixel spacing. Thus, the DC removal amplifiers inherently have a band-pass characteristic. The inherent low-pass element of the band-pass characteristic may be modified by multiplying the secondary inputs by different weighting factors prior to the averaging. The weighting factors can be positive or negative numbers.

The DC removal amplifier may be formed of first and second differential cells, with the second differential cell having a negative feedback loop from its output to its input. The second differential cell may also have a DC input to establish a mid range voltage that facilitates downstream differential operations. While not critical to the invention, the DC removal amplifier may include offset correction and may include a switching network that enables a user to switch inputs to the DC removal amplifier or to set the operation of the amplifier in a test mode.

BRIEF DESCRIPTION OF THE DRAWINGS

FIG. 15 is a table of the transfer characteristics of each of four modes of operation for the DC removal amplifier of FIG. 14, as achieved by means of the configuration circuitry of FIG. 13.

BEST MODE FOR CARRYING OUT THE INVENTION

Figure 1:
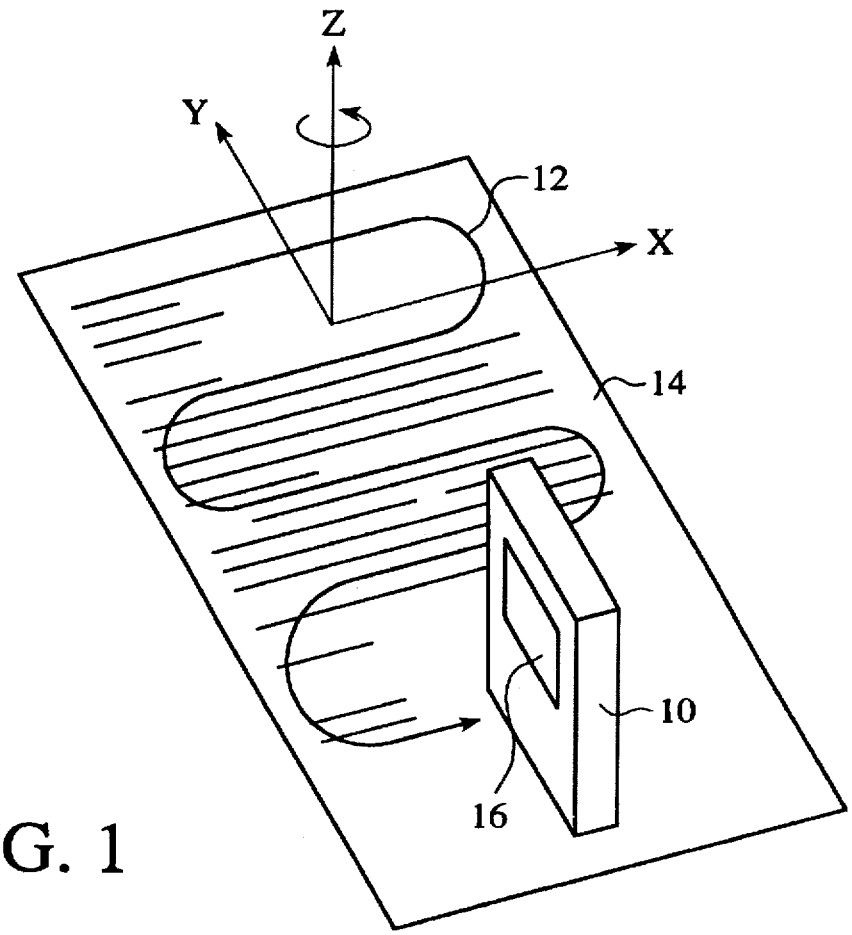
FIG. 1 is a perspective view of a hand-held scanning device following a meandering path on an original.

With reference to FIG. 1, a portable, hand-held scanning device 10 is shown as having followed a meandering path 12 along an original 14. The original may be a piece of paper, but the invention may be used with other imaging-bearing substrates. In use of the hand-held scanning device, the positions of inherent structural features, such as paper fibers, may be tracked and the resulting positional information may be used to rectify image data. However, the invention may be used in other applications.

The scanning device 10 is preferably self-contained and battery operated. However, the device may include a connection to an external source of power or to data ports of computers or networks. The scanning device includes an image display 16. The display may provide almost immediate viewing of a captured image. The display is not critical.

The scanning device 10 allows three degrees of freedom, with two being in translation and one in rotation. The first degree is the side-to-side movement (X axis movement) along the original 14. The second degree of freedom is movement upwardly and downwardly along the original (Y axis movement). The third degree of freedom is the ability to operate the device with rotational misalignment of a linear array of image sensor elements relative to the edge of the original 14 (θ-misalignment as a result of Z axis movement). That is, it is not necessary to maintain the linear array of imaging elements perpendicular to the direction of device translation.

Figure 2:
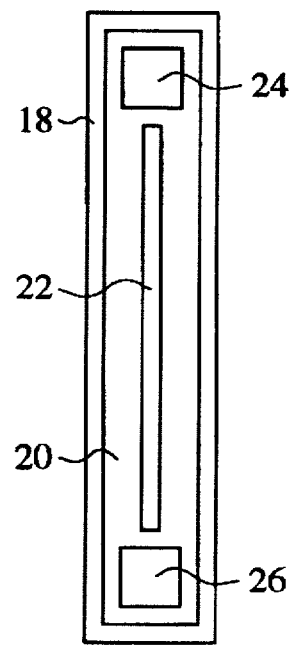
FIG. 2 is a bottom view of imaging and navigation sensors of the scanning device of FIG. 1.

Referring now to FIGS. 1 and 2, the bottom side 18 of the scanning device 10 includes a pivoting member 20 that aids in maintaining proper contact between the original 14 and an imaging sensor 22. Navigation sensors 24 and 26 are located at the opposed ends of the imaging sensor. Because the navigation sensors are mounted on the pivoting member, the navigation sensors are in a fixed location relative to the imaging sensor.

For reasons of physical compactness, the imaging sensor 22 is preferably a contact image device, but for applications in which compactness is less of a concern or a smaller image is desired, sensors employing projection optics may be employed, with magnification less than unity. Contact imaging devices typically employ lenses sold under the trademark SELFOC, which is a federally-registered mark of Nippon Sheet Glass Company Limited. Less conventionally, contact imaging can be obtained using interleaved array elements of sources and proximal sensors, without any imaging lenses. Conventional imaging sensors for scanning applications may be used. The imaging sensor may be part of a unit that also includes an illumination source, illumination optics, and image transfer optics.

In FIG. 1, the meandering path 12 is shown as having four and a fraction swaths, i.e., side-to-side passes across the original 14. A useful imaging sensor 22 for most applications has a length within the range of 25 mm and 100 mm. The swaths should include regions of overlap, so that a stitching process may be used to produce a faithful representation of the scanned original.

NAVIGATION SENSORS

The scanning device 10 includes at least one navigation sensor 24 or 26. In the preferred embodiment, the device includes a pair of navigation sensors, with the sensors being at opposite ends of the imaging sensor 22. While one-dimensional arrays of photoelements that are mounted orthogonally to each other may be used, the much preferred embodiment is one in which each navigation sensor is a two-dimensional array of elements. The navigation sensors 24 and 26 are used to track movement of the scanning device 10 relative to the original.

Each navigation sensor is an array of photoelements that is formed on an integrated circuit substrate that includes readout and signal processing circuitry. The position accuracy necessary over the range of a pixel distance of 40 μm is 2.0 μm. The very high positional accuracy requires individual photoelements that are no larger than tens of microns in length in order to acquire sufficiently differing signals from element to element. In the preferred embodiment, the pixel size desired on the paper original 14 is 40 μm and a magnification of 1.5 is achieved by the imaging optics, so that the photoreceptor elements of the navigation sensors 24 and 26 are 60 μm×60 μm. A greater optical magnification would enable larger pixels to be used. However, it is desirable to keep the pixel size as small as possible, consistent with performance objectives, to minimize the overall silicon area required, and hence the cost of the array. Each navigation sensor may be an array having sixty-four columns and thirty-two rows. However, none of these numbers is critical to the invention.

In the operation of the navigation sensors 24 and 26, the desired signal is the difference in reflectivity from pixel to pixel, as caused by variations along the surface of the original 14. Where surface variations are variations in paper texture along a white paper, the reflectivity may vary by only approximately six percent of the basic reflectivity of the white paper. Consequently, the circuitry to be described below must be designed to minimize noise and to ensure voltage stability.

Figure 3:
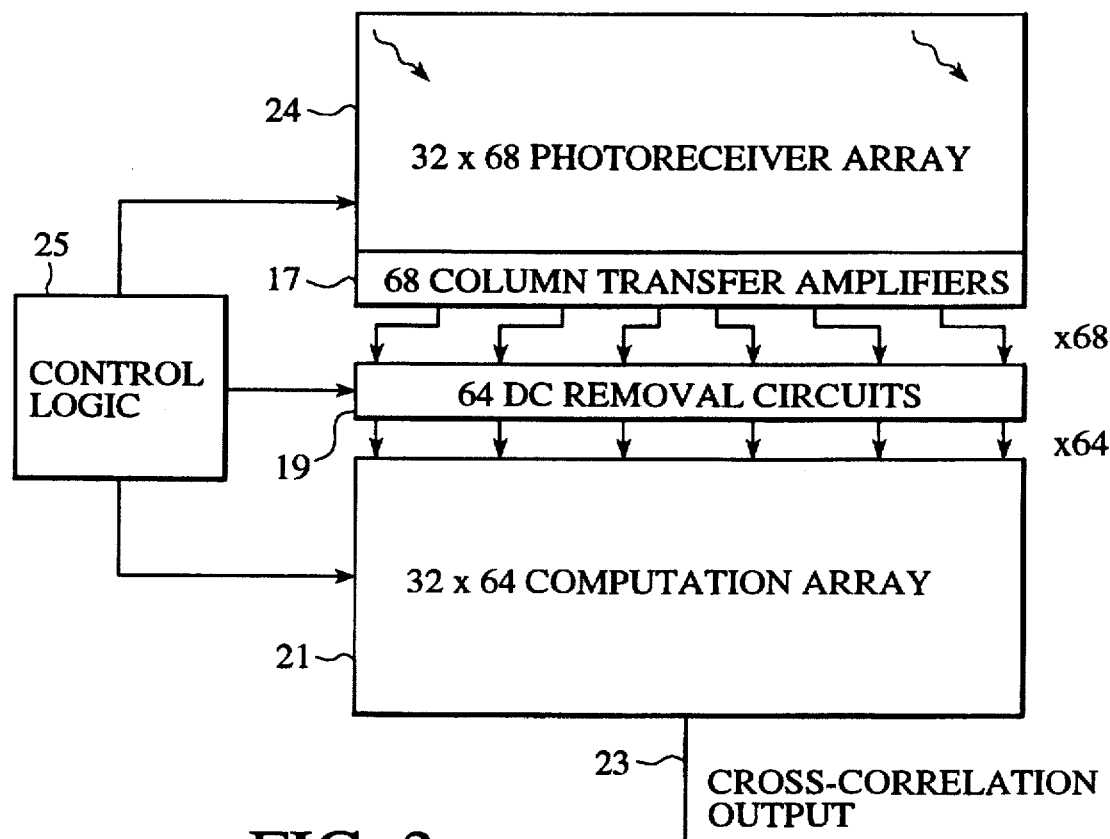
FIG. 3 is a block diagram of a photoreceiver array and processing circuitry in accordance with the invention.

FIG. 3 is a block diagram of circuitry to be formed in a single integrated circuit chip. The chip is an analog signal processing chip designed to acquire and process two-dimensional images, providing cross-correlation information to an external controller, not shown. In the embodiment described above, the controller uses the image cross-correlation values to derive X-Y position information. The X-Y position information is then used to accurately reconstruct a linear image from the image data acquired using imaging sensor 22 in FIG. 2.

In the embodiment of FIG. 3, the navigation sensor 24 is an array having thirty-two rows and sixty-eight columns of photoelements. An array of sixty-eight column transfer amplifiers 17 transfers signals in a row-to-row fashion from the navigation sensor 24 to an array of sixty-four DC removal circuits 19. In a cost-efficient image-capture system, it is difficult to illuminate a target area with perfectly consistent light intensity across the entire area to be imaged. The ability to provide uniform illumination is often proportional to the cost of the optics and the light source. Moreover, in the absence of cell-by-cell calibration of a conventional integrated light sensor, some variations in sensitivity will occur as a result of limitations of integrated circuit processing technology. In the navigation system for use with the analog signal processing chip of FIG. 3, it is required that cross-correlations be calculated between an incident image and an image captured previously at a different location relative to an imaging array. Any variations in illumination and photoelement sensitivity will degrade the correlation signal. Consequently, the spatial DC removal circuits 19 of FIG. 3 have been designed to maintain the integrity of the correlation signals, while keeping the cost of the system relatively low. Low spatial frequency changes in illumination and photoelement sensitivity which would otherwise corrupt the correlation signal are removed from the navigation image. In addition, the DC removal circuits also have an inherent low-pass characteristic. A computational array 21 receives data from the DC removal circuits 19 and performs local difference computations on the data before transferring a cross-correlation output 23 to the off-chip controller. Also shown in FIG. 3 is a source 25 of control logic for the various components of the chip.

PHOTOELEMENT CIRCUIT

Figure 4:
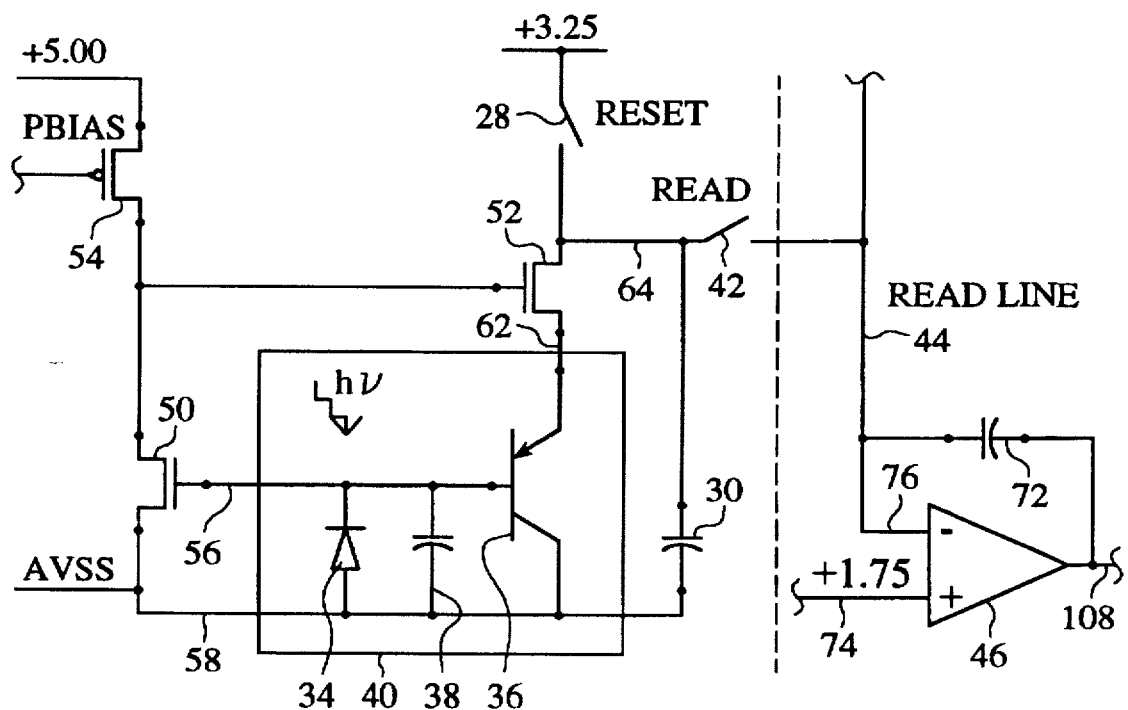
FIG. 4 is a photoelement circuit connected to a transfer amplifier in accordance with the invention.
Figure 5:
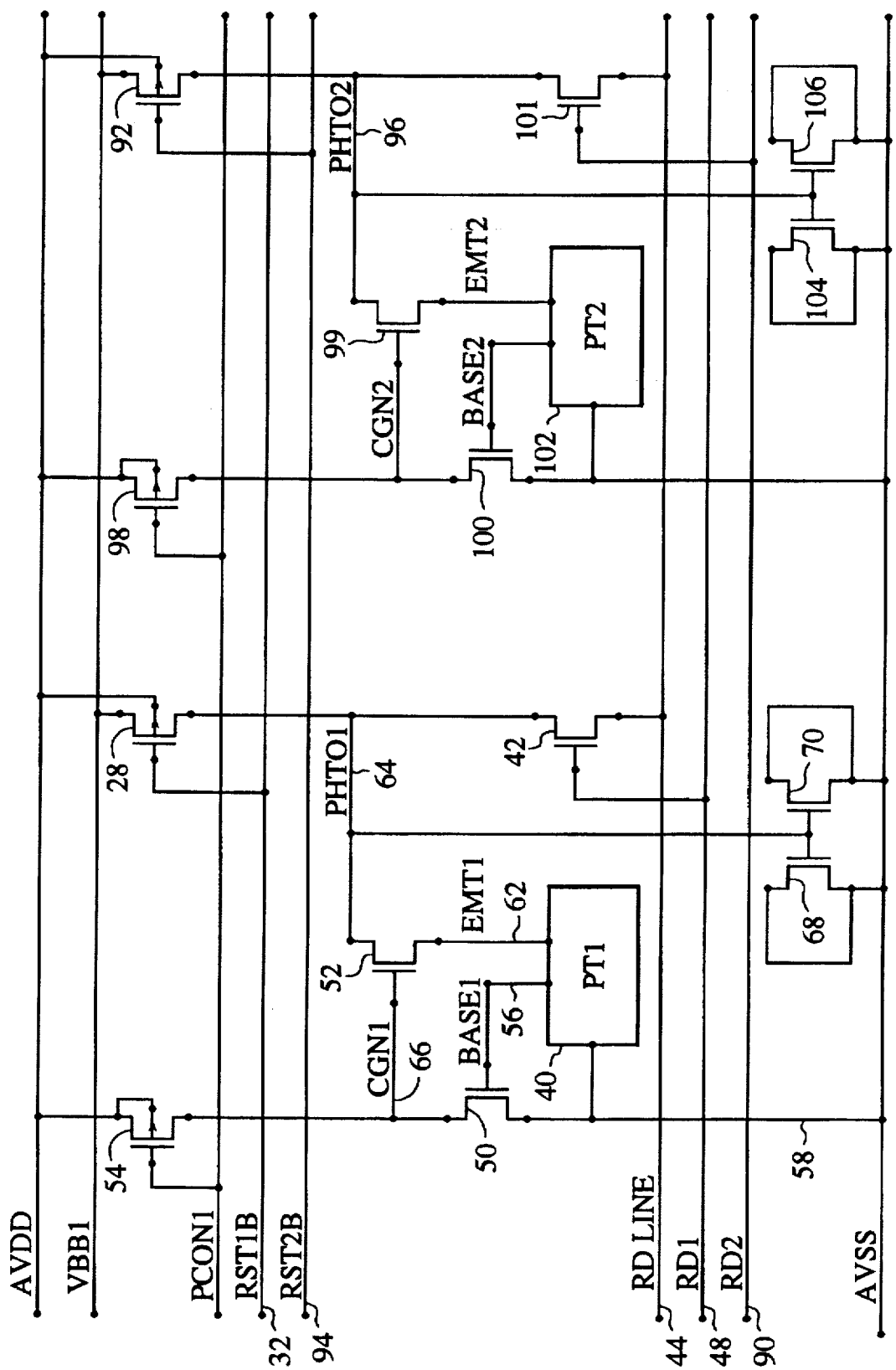
FIG. 5 is a schematic diagram of a photoelement pair in accordance with the invention.

FIG. 4 is a schematic diagram of a photoelement circuit. FIG. 5 is a more detailed circuit diagram of a photoelement pair. Incoming light is converted into a current that is integrated during a sample period. The stored value is periodically read out, so that it is available for a next step in a processing sequence. At the start of an integration cycle, a reset switch 28 in FIG. 4 is turned "on" momentarily to reset an integration capacitor 30 to 3.25 volts. As shown in FIG. 5, the reset switch 28 is a p-channel transistor that is turned "on" by applying a logic low to the gate of the transistor via a first reset line 32. Photocurrent that is generated by means of a photodiode 34 is amplified by a PNP transistor 36. The photodiode and the transistor, along with a parasitic capacitance 38, define a photoelement 40. The amplified photocurrent charges the integration capacitor 30 downwardly toward a level of 1.75 volts via a transistor 52. At the end of the sample period, a read switch 42 is turned "on" to output the stored value along a read line 44 to a transfer amplifier 46. As shown in FIG. 5, the read switch is an n-channel transistor that is controlled by a read control line 48.

The photodiode 34 of the photoelement 40 generates a current in response to reception of light photons. The photodiode is connected to the base of the PNP transistor 36. The photodiode may be the base/collector portion of the transistor, so that the transistor is a phototransistor. The reverse bias diode capacitance 38 is a parasitic capacitance that may be 0.16 pF. In the embodiment described above, in which there is a 32×68 element array, the optical power on the photodiode was determined to be 1.1 nW. This causes a current of 0.6 nA in the diode current source. Because of the low current level, amplification is needed to ensure that the optical variation signal, which is only approximately six percent of the base photocurrent for applications in which surface texture is the image of interest, will create sufficient voltage differences to be distinguished from noise.

The PNP transistor 36 of the photoelement 40 amplifies the photocurrent. The amplification provided by the transistor allows use of an integration capacitor 30 that facilitates reproducibility from photoelement to photoelement. In the absence of amplification, the low current from the photodiode 34 would require a very small capacitor, e.g., 10 fF, as an integrator in order to get a 2 volt swing. Because of the parasitics, this would be difficult to reproduce on an element-to-element basis. Changing the photoelement layout from a diode to a substrate PNP device is a convenient way of providing current amplification. A beta value of 18 increases the output emitter current to 11.4 nA. Thus, an integration capacitor of 0.20 pF can be used. This facilitates reproducibility, but is not so large as to require excessive area.

A concern with the circuit of FIG. 4 is that a direct beta dependency is introduced into the output current determination and, therefore, the integration capacitor voltage. However, testing has shown that matching of the devices from unit to unit is good, so that the effects of the beta dependency should be minor.

A servo circuit is formed by three MOS transistors 50, 52 and 54. The three MOS transistors form an amplifier with a common gate stage 52 for the output of the phototransistor 36. To achieve proper transfer of the current generated in the photoelement 40 to the integration capacitor 30, the photodiode reverse voltage (i.e., the transistor base voltage) must be kept at a substantially constant level. If the voltage at the base node 56 were to be allowed to shift, the photocurrent would be at least partially consumed in charging and discharging the diode capacitance 38 or the transistor base-collector capacitance, rather than providing current to be amplified by the substrate PNP transistor 36.

The transistor base voltage at the node 56 is kept at a substantially fixed level by the three MOS transistors 50, 52 and 54. While not critical to achieving the desired operation, in the embodiment of FIGS. 4 and 5 the substantially fixed voltage level is approximately equal to the NMOS threshold level above AVSS at the collector node 58. The three MOS transistors operate as a negative feedback loop by means of transistor 52 operating as a source follower to the emitter node 62 of the PNP transistor. Thus, the base voltage is controlled by the emitter voltage of the transistor. This is possible because the base voltage, i.e. the photodiode output at capacitor 30, has a very high impedance level. Transistor 52 acts as a common gate stage that has an added advantage of providing additional isolation of the emitter node 62 and the base node 56 of the transistor from the voltage swing of a PHTO1 node 64.

Figure 6:
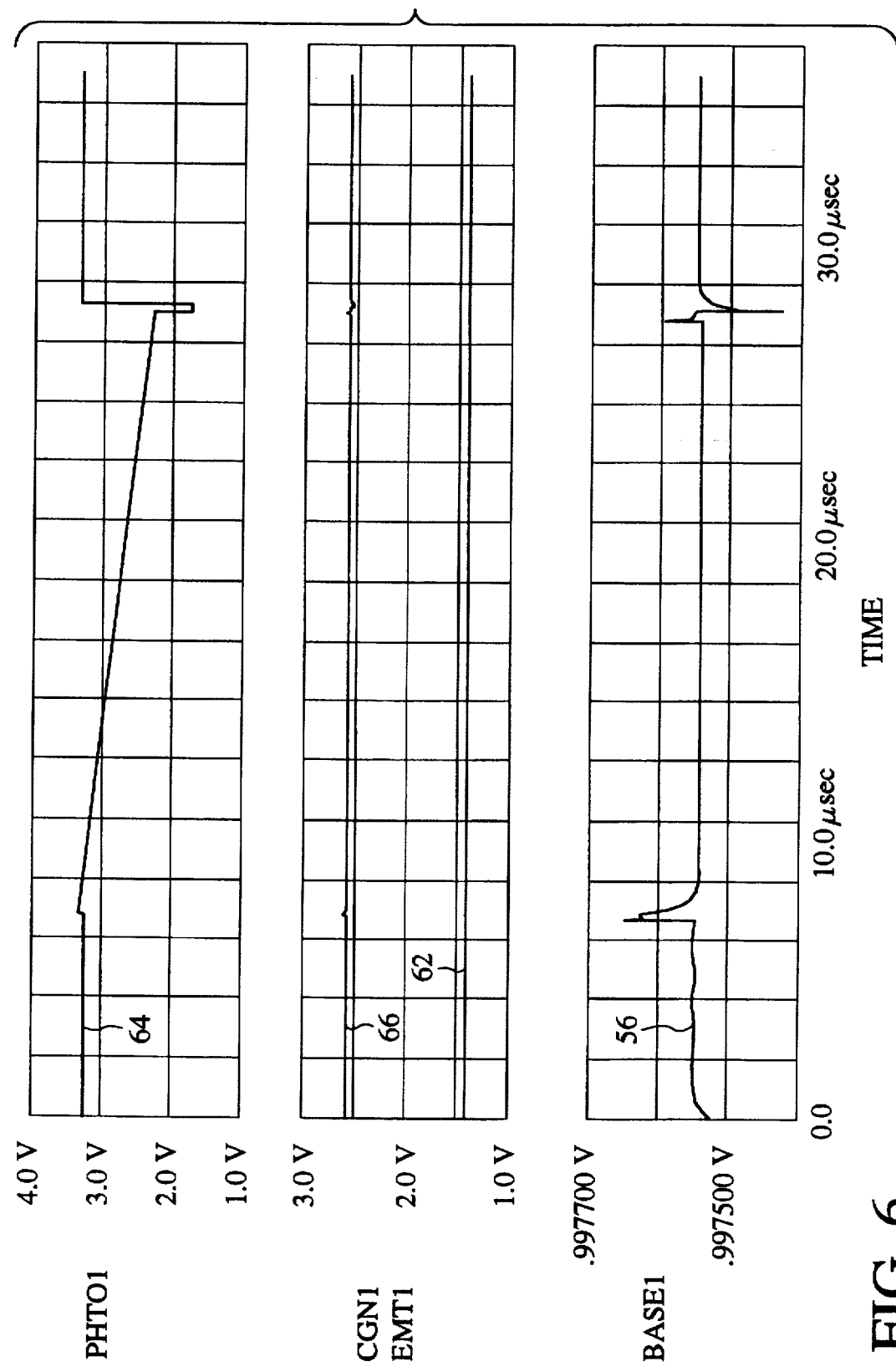
FIG. 6 is a timing diagram for the circuit of FIG. 5.

Referring now to FIGS. 4, 5 and 6, for the reset period, the output voltage at the PHTO1 node 64 is held at 3.25 volts, i.e. VBB1, by the reset switching transistor 28. With the switching transistor electrically "on," the CGN1 node 66 is held at approximately 2.6 volts and the emitter node 62 is held at approximately 1.4 volts. The base voltage at node 56 is near 1.0 volts.

When the light source that illuminates the medium of interest is turned "on," a photocurrent of approximately 0.6 nA flows from the base of the transistor 36 to the collector node 58, which is connected to AVSS. At 7.0 μs from the start of the timing sequence of FIG. 6, the reset signal at the first reset line 32, i.e. RST1B, is caused to go to logic high, thereby turning "off" the reset switch 28. As a result, the output at the PHTO1 node 64 ramps downwardly in a linear manner as the current of the phototransistor 36 emitter is pulled from a capacitive structure formed by the gate-to-channel capacitance of a first n-channel transistor 68 in parallel with a second n-channel transistor 70. The transistors 68 and 70 of FIG. 5 are represented by the integration capacitor 30 in FIG. 4. The range of voltage of interest is from 3.25 volts to 1.75 volts. Consequently, the gates of the first and second n-channel transistors 68 and 70 are kept sufficiently high that the gate-to-channel capacitance of the devices is above the threshold level of the devices.

During the integration time in which the reset switch 28 is "off," the voltages at the emitter node 62 and the base node 56 remain stabilized by the negative feedback loop described above. The voltage at the base node stays within a range of approximately 2 reV.

After approximately 20 microseconds of integration time, for this simulation exercise, read switch 42 is turned "on" with a positive going gate pulse to transistor 42 by means of the read control line 48. The positive gate pulse lasts for approximately 200 ns. The operation of the transfer amplifier 46 pulls the PHTO1 node 64 down to 1.75 volts. This accomplishes the transfer of the signal from the integration capacitor 30 of FIG. 4 to the capacitor 72 in the transfer amplifier. At the conclusion of the transfer process, the read control line 48 is caused to return to a logic low and the first reset line 32 is also caused to go low. This turns the reset switch 28 "on," pulling the PHTO1 node 64 back up to 3.25 volts.

CHARGE TRANSFER

The basic operation of a particular column transfer amplifier 46 will be described with reference to FIG. 4. When the transfer amplifier is not in a readout mode, the read line 44 is shunted to the second input 74 of the amplifier. That is, the two inputs are held at 1.75 volts. At the same time, the output line 108 is connected to a second source of a fixed voltage. While not critical, the voltage at the output line 108 may be 3.25 volts. The integration capacitor 30 is also connected to 3.25 volts by means of the reset switch 28.

Referring to FIGS. 4 and 5, when the reset switch 28 is opened, the charge across the integration capacitor 30 will vary depending upon the photocurrent generated at the photoelement 40. Following an integration period of approximately 40 μs, the first input line 76 and the output line 108 of the transfer amplifier are disconnected from the fixed voltage sources of 1.75 volts and 3.25 volts, respectively. Upon connection of the integration capacitor 30 to the first input line 76 by turning the read switch 42 "on," a positive perturbation is received at the first input line of the transfer amplifier. The output of the amplifier will go negative, pulling charge through the transfer capacitor 72 from the read line 44, bringing the voltage value back to 1.75 volts. This is caused by the gain of the amplifier. Since charge is conserved, the amount of charge required to bring the integration capacitor 30 from its final integration value to the potential, i.e. 1.75 volts, of the second input line 74 is pulled from the integration capacitor 30 onto the transfer capacitor 72. The equation governing the operation of the integration and charge transfer is:

$$out = V_{out} - [(V_{cap} - I_{ph}(\beta+1)T_{int}/C_{int}) - V_{bott}]C_{int}/C_{tran}$$

where out is the output voltage of the transfer amplifier at the end of the transfer operation, $V_{out}$ is the starting voltage at the output line 108 (i.e., 3.25 volts), $V_{cap}$ is the starting voltage for the integration capacitor (i.e., 3.25 volts), $I_{ph}$ the photodiode current (i.e., 0.6 nA), $\beta$ is the beta of the photo transistor 36 (i.e., 18), $T_{int}$ is the integration time for the photoreceiver (i.e., 40 μs), $C_{int}$ is the value of the integration capacitor (i.e., 0.2 pF), $V_{bott}$ is the bias value at the second input 74 of the transfer amplifier (i.e., 1.75 volts), and $C_{tran}$ is the value of the transfer capacitor (i.e., 0.4 pF).

As previously noted, the operation of the computational array 21 of FIG. 3 is a correlation operation. If the initial part of the correlation operation is considered, the difference between signals of two nearest-neighbor photoelements is subtracted. Accurate interpretation of the data requires that the input signals to the computational array are strongly dependent upon the differences in optical illumination received at the various photoelements of the photoreceiver array 24. Consequently, the mismatch of devices resulting from manufacturing differences of devices will cause inaccuracies. Moreover, the integration time for the photoelements is 40 μs, providing a cycle time for reading out the entire array in the order of 50 μs. Since CMOS circuitry is preferred in order to achieve low power operation with high circuit density, 1/f noise is also a concern. Analysis has shown drift in the offset of the transfer amplifier 46 is likely to occur during this time frame. Consequently, a mechanism to align all of the column transfer amplifiers to substantially the same value of offset would permit the operation of the subsequent processing to be more accurate. As a result, the offset control operation to be described below is provided.

OFFSET COMPENSATION

Figure 7:
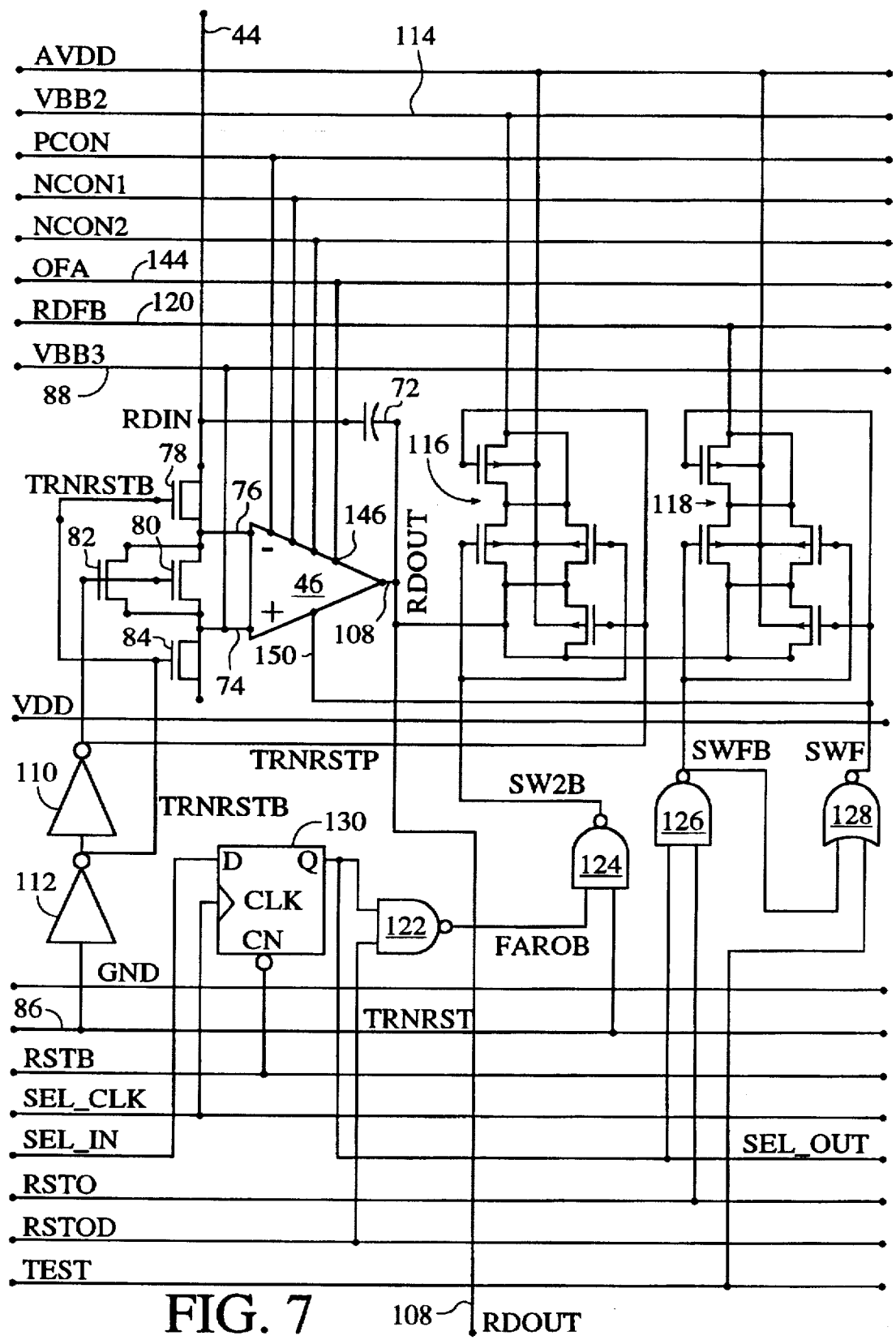
FIG. 7 is a schematic diagram of the circuitry for operating the transfer amplifier of FIG. 4.

Referring now to FIG. 7, the column transfer amplifier 46 is shown as having the first and second inputs 74 and 76 selectively shunted together by four transistor devices 78, 80, 82 and 84. Two of the transistors operate as switches, while the other two provide a degree of charge injection compensation. The switching of the transistor devices is controlled by a signal at a TRNRST line 86. When the signal on line 86 is high, inputs 74 and 76 are both connected to a source of a fixed voltage via the VBB3 line 88. In the example above, the VBB3 voltage is 1.75 volts. Inverters 110 and 112 provide the proper signal levels to the transistor devices 78-84.

When the column transfer amplifier 46 is between readout operations, the signal on line 86 places the transfer amplifier in a reset mode. The transfer reset signal connects the inputs 74 and 76 together and simultaneously connects the output line 108 to a source of VBB2, via line 114. A second bank of four transistor devices 116 is controlled by the transfer reset signal on TRNRST line 86 in order to connect or disconnect the output line 108 to the source of VBB2. In the embodiment described above, the VBB2 voltage is 3.25 volts. The selection of the input and output voltages ensures that the output voltage is centered approximately in the mid range of the operating voltage supply for subsequent stages. Within the second bank 116 of transistor devices, two of the devices are provided in order to achieve charge injection compensation.

A third bank 118 of four transistor devices is included in order to selectively connect the output line 108 of the transfer amplifier 46 to a read feedback line 120. The third bank 118 and the read feedback line 120 form a portion of an offset adjustment loop. Again, two of the transistors in the bank are present solely for the purpose of charge injection compensation. A number of gates 122, 124, 126 and 128 and a clock device 130 are connected to provide proper operation of the second and third banks 116 and 118. Each of these devices operates in a conventional manner and may be readily replaced by other conventional circuitry, as will be understood by persons skilled in the art.

Figure 8:
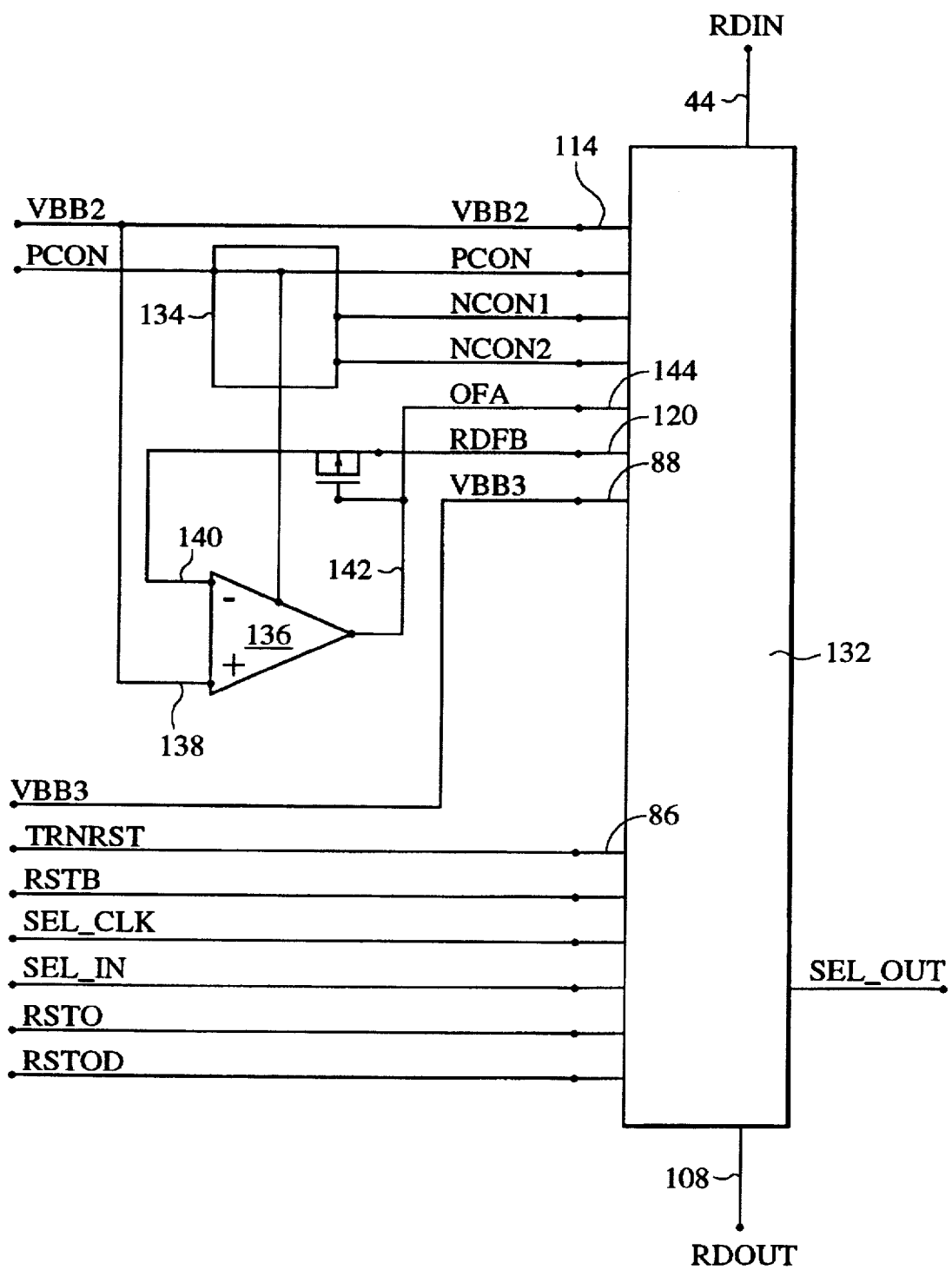
FIG. 8 is a schematic diagram of a circuit for determining offset adjustment for the transfer amplifier of FIG. 7.

When the transfer amplifier 46 is in a reset mode, the two inputs 74 and 76 are connected to 1.75 volts by means of the first bank of transistors 78-84 and the output line 108 is temporarily connected to 3.25 volts by means of the second bank 116 of transistor devices. During an offset control operation, the third bank 118 of transistor devices connects the output line to the read feedback line 120 after the second bank 116 is turned "off." Turning now to FIG. 8, for the purpose of reducing complexity, the circuitry of FIG. 7 has been reduced to a single block 132. Also shown in block form is a voltage source 134 for the various bias and reset voltages necessary to operate the circuitry. Finally, FIG. 8 shows an offset adjustment amplifier 136 having a first node 138 connected to the VBB2 line 114 and having a second node 140 connected to the read feedback line 120.

The offset adjustment amplifier 136 is common to all of the column transfer amplifiers 17 of the photoreceiver array 24 of FIG. 3. However, the second node 140 in FIG. 8 is connected to only one transfer amplifier at any given time. In fact, when the sixty-eight column transfer amplifiers are simultaneously in a readout mode, the second node 140 will be electrically isolated from receiving any signals from the transfer amplifiers.

In the operation of the offset adjustment amplifier 136, the voltage state at the read feedback line 120 is compared to the fixed voltage at the VBB2 line 114. In the ideal, the voltage states at nodes 138 and 140 will be identical, so that the voltage at output node 142 and at OFA line 144 will be at the nominal output bias level. However, variations in device fabrication and other performance mechanisms will generate offsets. As a result, the voltage states at nodes 138 and 140 will be different, producing an offset signal that is conducted to the circuitry block 132 via OFA line 144. As shown in FIG. 7, line 144 is connected to the column transfer amplifier 46 to provide offset compensation of the transfer amplifier.

Figure 9:
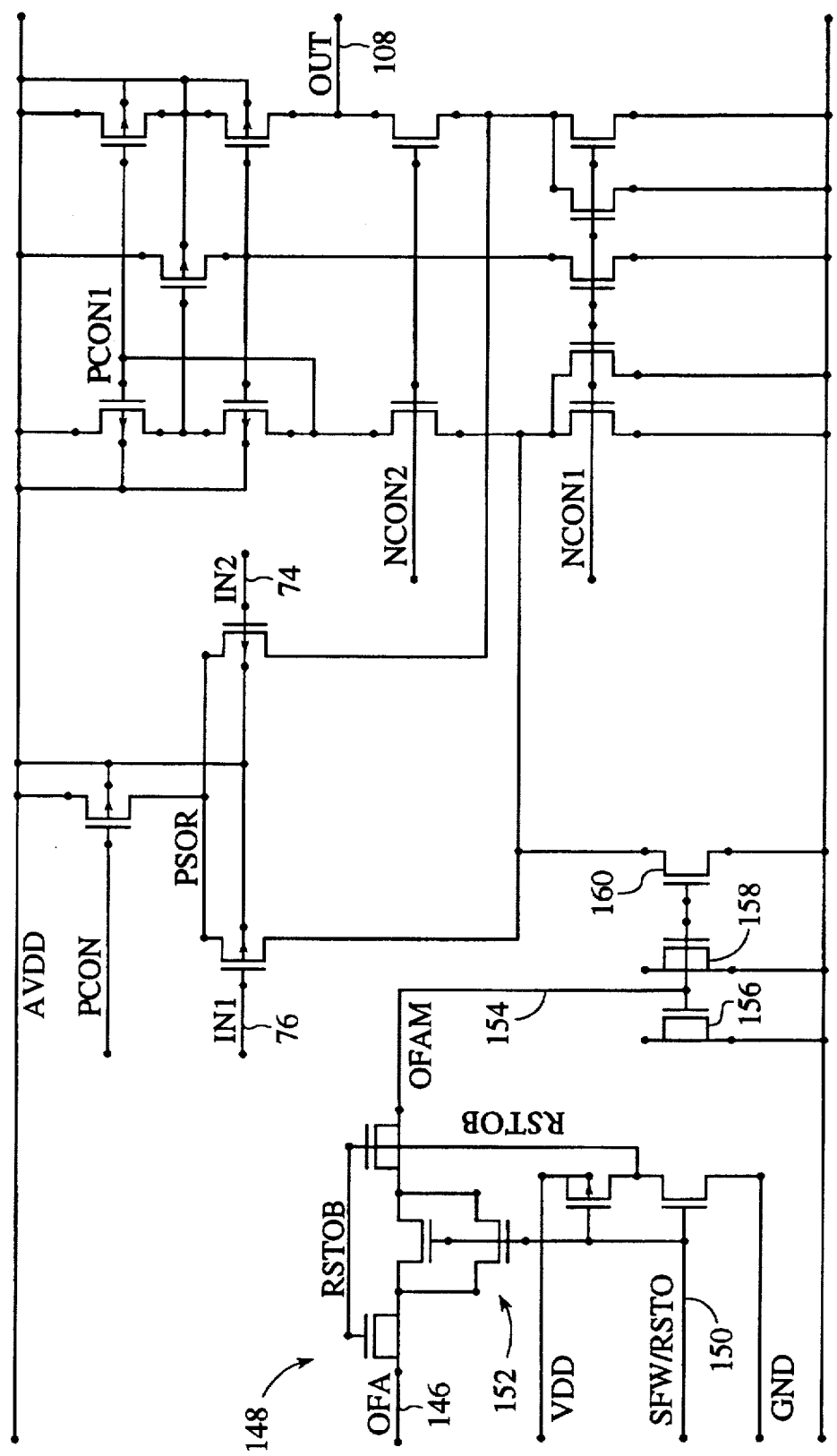
FIG. 9 is a schematic diagram of the transfer amplifier of FIG. 4.

The OFA line 144 is connected to the transfer amplifier 46 at an offset correction port 146, as shown in FIG. 7. Turning to FIG. 9, the internal circuitry of the transfer amplifier 46 is shown. Part of the circuitry of FIG. 9 is conventional and is readily understood by persons skilled in the art. Such conventional circuitry will not be explained herein. However, added to the conventional circuitry is an offset sample-and-hold circuit 148 that is accessed by the offset correction port 146 of the transfer amplifier. At the end of a reset operation in which the particular transfer amplifier is connected to the offset adjustment amplifier 136 of FIG. 8, the sample-and-hold circuit is refreshed. A signal received at a refresh port 150 of the transfer amplifier properly biases a fourth bank of transistor devices 152 for connecting the offset correction port 146 to OFAM line 154. The OFAM line 154 leads to a pair of transistors that combine to operate as a storage capacitor for the offset adjustment signal. A third transistor 160 is biased by the offset correction signal to provide offset compensation to the conventional circuitry of the transfer amplifier.

In operation, the offset correction is achieved by forming a loop that originates at the output line 108 of the transfer amplifier 46 and continues to the offset correction port 146 of the transfer amplifier. Referring to FIG. 7, with the first and second inputs 74 and 76 of the amplifier connected to VBB3 (e.g. 1.75 volts) and the output line 108 connected to and then disconnected from VBB2 (e.g. 3.25 volts) by means of the second bank 116 of transistor devices, the offset control operation is initiated by connecting the output line 108 to the read feedback line 120 by means of the third bank 118 of transistor devices. In the absence of a need of offset correction, the voltage state at the read feedback line 120 will be equal to VBB2. Referring now to FIG. 8, the offset adjustment amplifier 136 compares the voltage at the read feedback line 120 to the anticipated voltage state, i.e. the VBB2 voltage. The amplifier 136 is a differential cell having an output node 142 connected to the offset adjustment line 144. This offset adjustment line completes the loop by connecting to the offset correction port 146 of the transfer amplifier 46, as shown in FIGS. 8 and 9. During a refresh interval, the fourth bank 152 of transistor devices allows the signal at the offset correction port 146 to be stored by means of transistors 156 and 158. The stored charge provides offset correction to the transfer amplifier circuitry until the next refresh interval.

Figure 10:
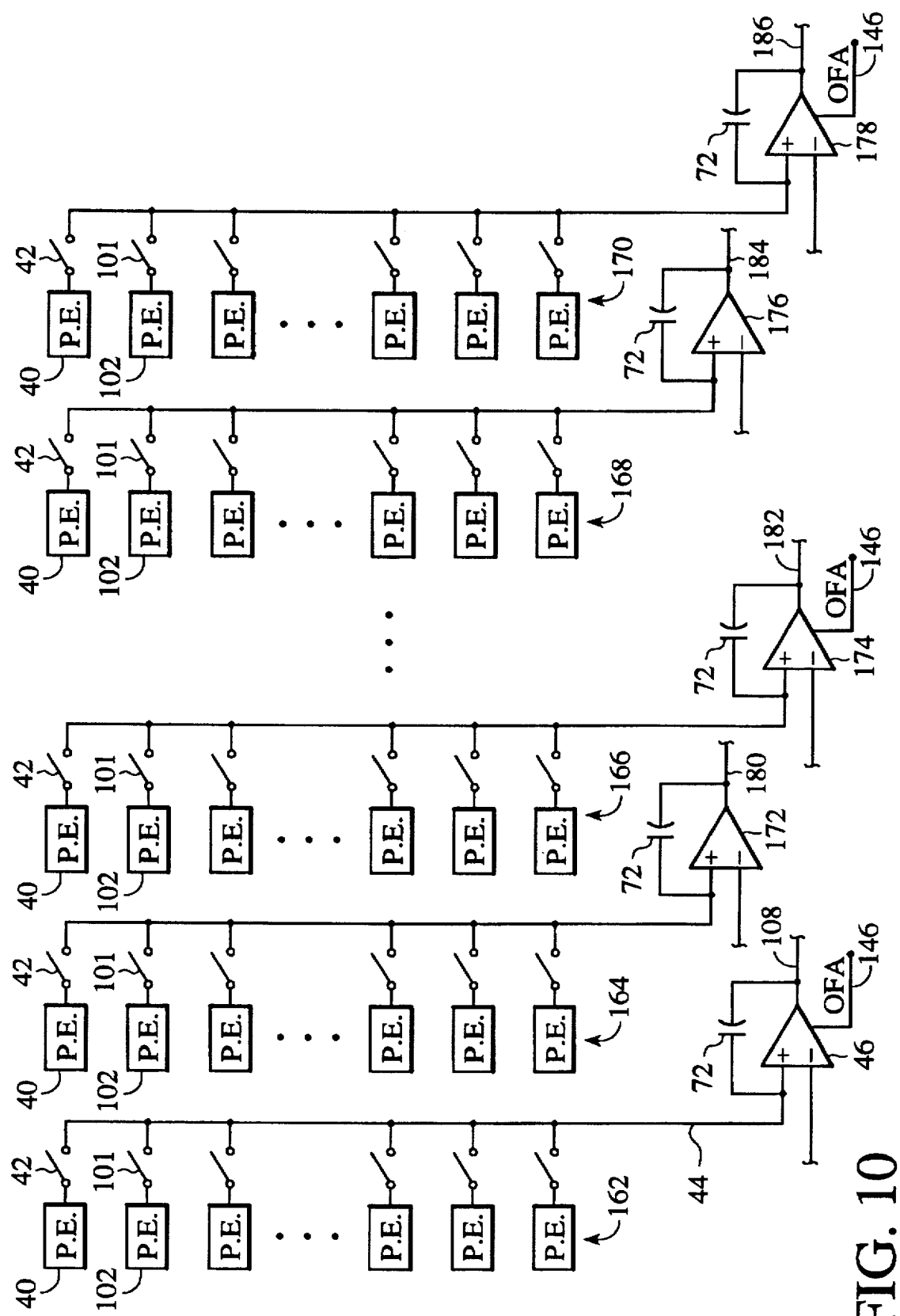
FIG. 10 is a block diagram of an array of photoelements and transfer amplifiers in accordance with the invention.

As previously noted, each column transfer amplifier 46 is sequentially connected to the photoelements in a particular row of photoelements. In one embodiment, there are sixty-eight columns and thirty-two rows of photoelements. FIG. 10 illustrates five of the columns 162, 164, 166, 168 and 170, with each column being selectively connected to a different transfer amplifier 46, 172, 174, 176 and 178.

Referring briefly to FIG. 5, the photoelement 40 of FIG. 4 is shown as being paired with a second photoelement 102 from the same column. Consequently, each photoelement is connected to the same read line 44 by means of turning "on" a read switch 42 and 101. Read control lines 48 and 90 provide individual control of the read switches, so that no two photoelements will be connected to the transfer amplifier simultaneously. Also shown are reset devices 28 and 92 that are connected to separate reset lines 32 and 94 and to the separate PHTO nodes 64 and 96. The second photoelement includes its own common gate arrangement provided by MOS transistors 98, 99 and 100 that operate in the same manner as the MOS transistors 50, 52 and 54 of the first photoelement 40. Finally, the second photoelement includes storage-capacitive transistors 104 and 106 that operate as the integration capacitor for the second photoelement.

In operation of the circuit of FIG. 10, the integration time for the photoelements 40 and 102 in each column 162–170 is approximately 40 µs. Following an integration interval, the read switch 42 of the first row of photoelements 40 is closed, so that each transfer capacitor 72 of the various transfer amplifiers 46, 172, 174, 176 and 178 receives a charge corresponding to the light energy that strikes the photoelement 40 in the first row. The received charge is transferred to subsequent processing circuitry via output lines 108, 180, 182, 184 and 186. The readout time of a single row is estimated to be between 200 ns and 300 ns. Following the readout of the first row, the read switches 42 are opened and the read switches 101 of the second row of photoelements 102 are closed. The process is repeated until each row of photoelements is read.

The offset adjustment operation described above requires no more than 4 µs. Therefore, at least eight transfer amplifiers 46 and 172–178 can be connected to the offset adjustment amplifier 136 of FIG. 8 in a sequential manner during each 40 µs integration interval in which the transfer amplifiers are idle between transfer operations. The sample-and-hold circuit 148 of each transfer amplifier, as shown in FIG. 9, is designed to ensure that there is no significant voltage droop at the storage capacitance provided by transistors 156 and 158. Thus, reset can occur without a time sacrifice with respect to transferring photoelement signals.

DC REMOVAL CIRCUITS

A concern in the processing of signals from the navigation array 24 of photoelements through the computational array 21 of FIG. 3 involves potential corruption of the processing as a result of a characteristic that is common within a neighborhood of photoelements. For example, a scanner may have a source for illuminating the substrate as the scanner is moved relative to an original. It is difficult to illuminate an entire viewing region without variations in illumination. Signal processing may be adversely affected by such variations.

The DC removal circuits 19 of FIG. 3 have the basic function of removing low spatial frequency variations within the neighborhood of photoelements. As noted above, the DC removal circuits may also have a low-pass characteristic that may be set to remove spatial frequency components at high frequencies. Thus, the DC removal circuits can have a band pass characteristic. The DC removal circuits transform the original image into an image of local differences. The local differences approach results in the original image being destroyed, but for applications such as the determination of scanner movement relative to an original, this is not a concern. The removal of low spatial frequencies maintains the integrity of correlation signals. Moreover, the local differences approach has the additional advantage of reducing the dynamic range requirements of the computation array 21, which actually calculates the image cross-correlations.

In addition to overcoming the adverse effects of variations in illumination of a substrate as viewed by the navigation sensor 24, the removal of low spatial frequencies renders the navigation operation less susceptible to such things as the navigation sensor being positioned so that one major region of the array views paper fibers of a shaded region of a scanned original, while the paper fibers viewed by a second portion of the array are outside of the shaded region.

Figure 11:
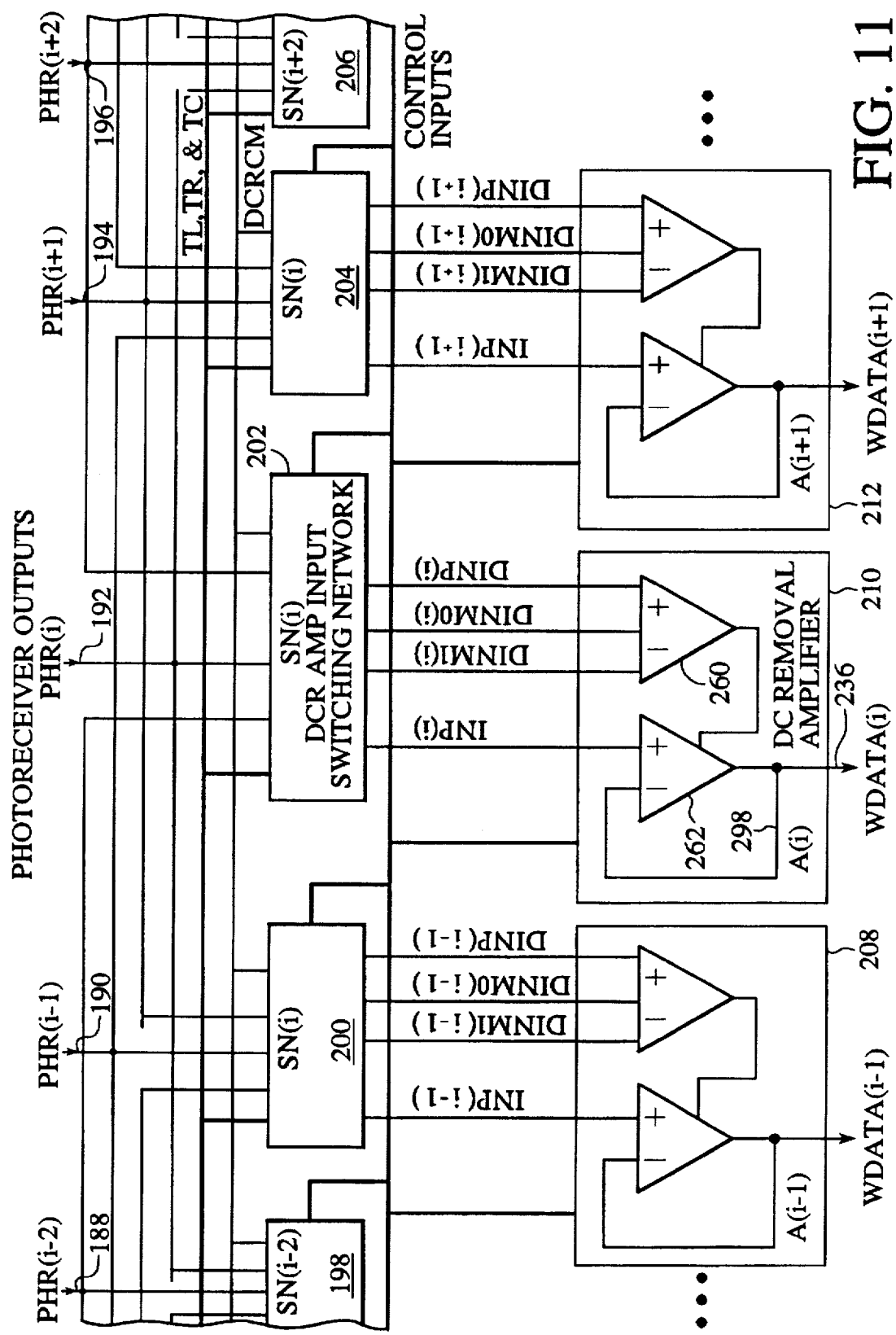
FIG. 11 is a block diagram of an array of switching networks and DC removal amplifiers to receive and process outputs from the transfer amplifiers of FIG. 10 in accordance with the invention.

Since the column transfer amplifiers 17 transfer the captured image data in a time multiplexed row-by-row fashion, DC removal can take place in parallel processing. In FIG. 11, five photoreceiver outputs 188, 190, 192, 194 and 196 from five different column transfer amplifiers are conducted to switching networks 198, 200, 202, 204 and 206. Each switching network gates its inputs through a series of switches controlled by digital control inputs from the control logic 25 of FIG. 3. The outputs of each switching network 198-206 are connected to an associated DC removal amplifier 208, 210 and 212. Depending upon the switching network, the DC removal circuits may be in any one of a number of modes, including a test mode and a DC removal disabled mode.

Referring briefly to FIG. 15, an example of four possible modes of operation of the DC removal amplifier 210 of FIG. 11 are characterized. In the NODCR (no DC removal) mode, the output 236 of the amplifier 210 is the same as the input INP, which is connected directly to the photoreceiver output line 192 by the switching network 202. In the TST (test) mode the output signal of the DC removal amplifier is dependent upon three known test outputs: TC, TL and TR.

In the DC removal modes of F1 and F2, low spatial frequency components of the photoreceiver output PHR(i) on line 192 are removed. To be explained in detail below is the implementation of the circuitry of FIG. 11 to subtract the photoreceiver output on line 188 from the photoreceiver output 192. The term DCRCM refers to a DC value that is selected to establish a positive mid range voltage value for enabling subsequent processing of the analog signal from WDATA(i) line 236. The F2 mode of FIG. 15 differs from the F1 mode in its selection of photoreceiver outputs at opposite sides of the photoreceiver output PHR(i). Because the switching network 202 is not connected to the nearest neighbor photoreceivers, a wider sampling for removing low frequency information is acquired. The "primary input" in the F1 and F2 modes is the PHR(i) output, and local differencing is achieved by the subtraction of secondary inputs from PHR(i+2) and PHR(i−2). An embodiment that allows two-dimensional DC removal will be described below when referring to FIGS. 16 and 17.

The function of the center switching network 202 will be described in greater detail with reference to FIGS. 11, 12 and 13. In addition to the connection 192 to the operatively associated photoreceiver PHR(i), the switching network 202 receives inputs from photoreceiver outputs 188 and 196, which are the photoreceivers removed by two from the photoreceiver of interest. The photoreceiver outputs are received via the transfer amplifiers described previously.

Other inputs for potential output by each switching network 202 are test inputs TL 214, TR 216, and TC 218. The test inputs are received from the control logic 25 of FIG. 3. Finally, a DC removal common mode (DCRCM) input 220 is connected to each switching network for potential output to the associated DC removal amplifier 210. DCRCM is a common mode signal that is essentially an addition of a DC term to allow the image signal to vary within the operational range of subsequent circuitry. For example, if the computational array 21 of FIG. 3 includes operational amplifiers that operate linearly only between 0 volts and 5 volts as their input, the common mode signal may be selected to be 2.5 volts.

Figure 13:
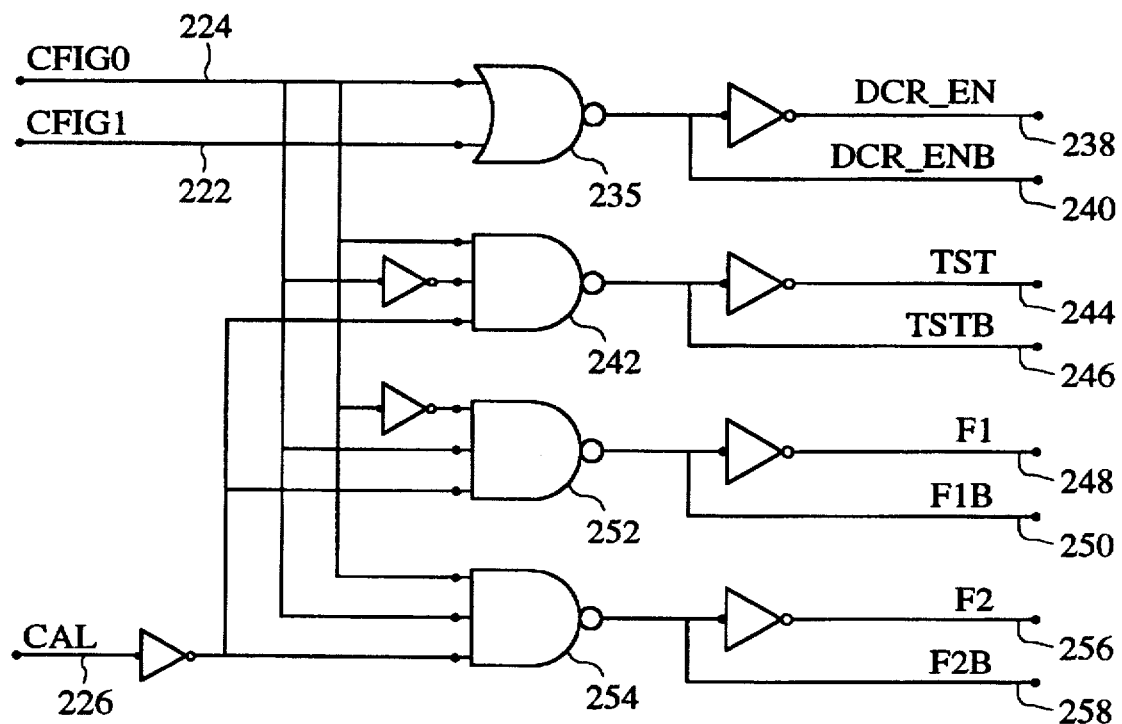
FIG. 13 is a schematic diagram of circuitry for configuring the switching circuitry of FIG. 12.

Referring now specifically to FIG. 13, the switching network is configured by setting a binary input pair CFIG1 222 and CFIG0 224 to one of four possible combinations. In addition, a calibration signal may be received at CAL line 226. The CAL signal is used to provide a condition in which only the INP(i) line 228 conducts a signal from the switching network 202 to the DC removal amplifier 210. Thus, the CAL signal disconnects the DIN outputs 230, 232 and 234 during an offset correction operation that is separate from the offset control operation of the transfer amplifiers.

Figure 12:
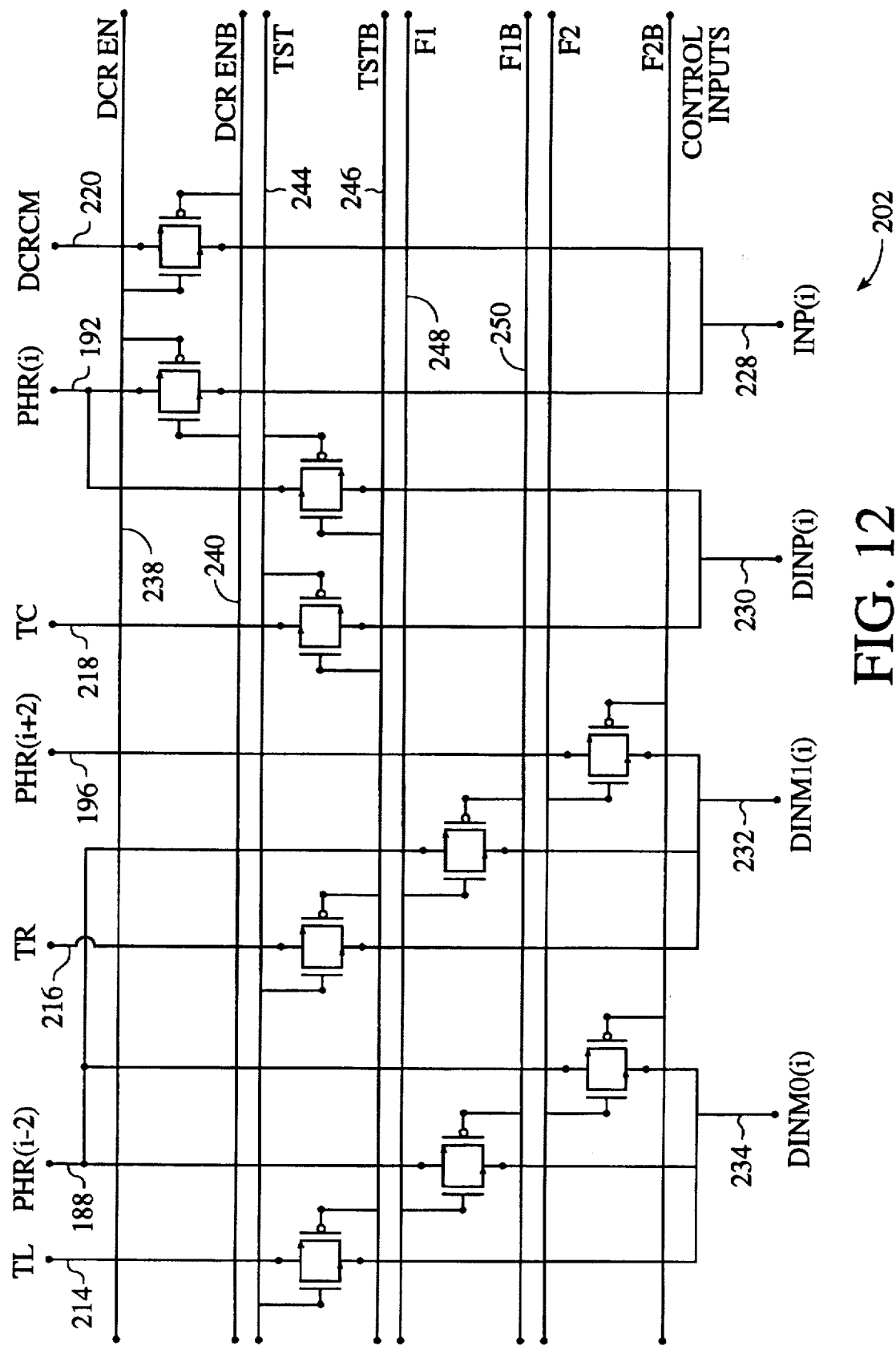
FIG. 12 is a schematic diagram of circuitry for switching signals transmitted to a DC removal amplifier of FIG. 11.

The circuitry of FIGS. 11–13 can be configured on one of four ways by controlling the configuration signals at lines 222 and 224. In a first mode, DC removal is disabled. In this mode, the photoreceiver output on lone 192 is routed through to the WDATA(i) output 236 via the INP(i) line 228. That is, the DC removal amplifier 210 acts as a unity gain amplifier in which PHR(i)=INP(i)=WDATA(i). The DIN signals along outputs 230, 232 and 234 are not utilized in this mode, since gates 242 and 252 in FIG. 13 do not provide the required DC removal enable signals at lines 244–250, 256 and 258.

In a second mode, the configuration signals at lines 222 and 224 define a test mode in which gate 242 provides enabling signals at lines 244 and 246. In this condition, the DCRCM common mode input 220 is passed through the switching network 202 to INP(i) line 228. Test inputs TL 214, TR 216 and TC 218 are passed through to outputs 234, 232 and 230, respectively. The test inputs are known signals, allowing complete characterization of the DC removal amplifier 210.

A third configuration of the switching network 202 is referred to as the DC removal function 1 mode. In the F1 mode, INP(i) line 228 is connected to the DCRCM line 220, DINP(i)=PHR(i), DINM0(i)=PHR(i−2) and DINMI(i)= PHR9i−2). This third mode is enabled by providing a logic high at line 250 and a logic low at line 248 by means of gate 252.

The fourth configuration is referred to as a DC removal function 2 mode. In the F2 mode, the signals at the 228, 230 and 232 outputs are the same as those of the F1 mode. That is, INP(i)=DCRCM, DINP(i)=PHR(i), and DINM0(i)=PHR (i−2). However, the F2 mode connects the DINMI(i) output 232 to the PHR(i+2) line 196. Gate 254 triggers the proper signals along lines 256 and 258 for enabling the F2 mode.

Figure 14:
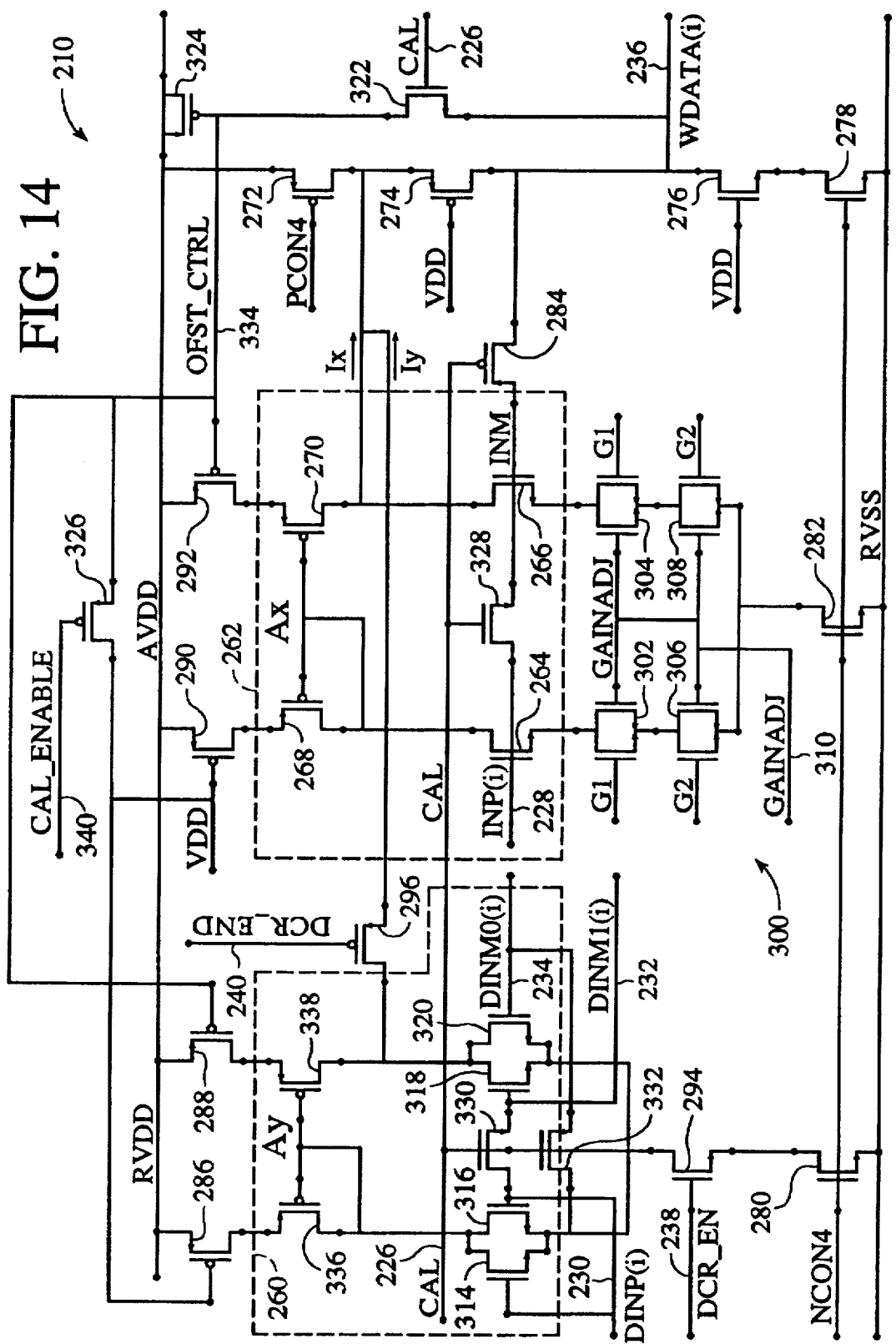
FIG. 14 is a schematic diagram of a DC removal amplifier of FIG. 11.

The DC removal amplifier 210 is shown in FIG. 14. The amplifier includes a first differential cell Ay 260 and a second differential cell Ax 262. The INP(i) output 228 is received at the second differential cell, while the other three outputs 230, 232 and 234 from FIG. 12 are received at the first differential cell.

The second differential cell 262 includes a differential pair of transistors 264 and 266. Transistors 268 and 270 provide a current mirror load for transistors 264 and 266. A folded cascode output stage is formed by four serially connected transistors 272, 274, 276 and 278. In addition to transistors 272 and 278, transistors 280 and 282 are biased by voltages NCON4 and PCON4 to act as constant current sources. These two voltages, as well as bias voltages VBP and VBN, are generated and provided by constant voltage sources.

As will be explained more fully below, the DC removal amplifier 210 includes offset correction circuitry. Transistors 284 acts as a switch to achieve unity gain feedback. Offset correction transistors 286, 288, 290 and 292 are biased in the triode region to introduce offset correction into the amplifier.

The DC removal operation is enabled by turning transistors 294 and 296 "on" using the signal lines 238 and 240 previously described with reference to FIG. 13. On the other hand, DC removal is disabled when switches 294 and 296 are turned "off", so that the amplifier 210 becomes a simple unity gain buffer amplifier with output WDATA(i)=INP(i).

In a DC removal mode, the first differential cell 260 generates a current ($I_y$) equal to:

$$I_y = gm_y(2 \cdot DINP - (DINM0 + DINM1)) \quad (1)$$

In the same manner, the second differential cell 262 generates a current ($I_x$) equal to:

$$I_x = gm_x(INP - WDATA) \quad (2)$$

Since the second differential cell includes negative feedback, shown simply as a feedback line 298 in FIG. 11, the current $I_x$ is forced to $-I_y$. Consequently, with DC removal enabled:

$$gm_y(2 \cdot DINP - (DINM0 + DINM1)) = -gm_x(INP - WDATA) \quad (3)$$

Equation (3) can be rewritten as:

$$WDATA = INP + \frac{gm_y}{gm_x}(2 \cdot DINP - (DINM0 + DINM1)) \quad (4)$$

Transconductance $gm_x$ is modulated by a bank 300 of eight transistors. Four of the transistors in the bank are biased in the triode region by a voltage GAINADJ to act as gain degeneration resistors to the differential pair of transistors 264 and 266. The other four transistors in the bank 300 are used as switches to selectively shunt the gain degeneration resistive transistors and are under the control of the G1 and G2 digital gain control inputs. The G1 and G2 voltages are set by the control logic 25 shown in FIG. 3.

Within the bank 300 of eight transistors, the four resistive transistors 302, 304, 306 and 308 may be referred to as $\Gamma_{302}$, $\Gamma_{304}$, and $\Gamma_{308}$, respectively. Including the effects of the gain degeneration resistances, the transconductance of the second differential cell 262 is:

$$gm_x = gm_{x0}\left(\frac{1}{1 + gm_{x0}(\overline{G1}r_{302} + \overline{G2}r_{304})}\right) \quad (5)$$

where $gm_{x0}$ is the non-degenerated gm of the second differential cell and where $\Gamma_{302} = \Gamma_{304}$ and $\Gamma_{306} = \Gamma_{308}$. The values $\overline{G1}$ and $\overline{G2}$ are the boolean complements of the digital control inputs G1 and G2 and have values of 0 or 1. The values of the degeneration resistors $\Gamma_{302} - \Gamma_{308}$ are modulated by varying the control voltage input GAINADJ signal at line 310.

Using $\beta_{264}$ and $\beta_{302}$, to denote $\mu_0 C_{ox} W/2L$ for transistors 264 and 302, and neglecting $VDS_{302}$ and $VDS_{304}$, $gm_{x0}\Gamma_{302}$ can be expressed as:

$$gm_{x0}\Gamma_{302} = \quad (6)$$

$$\frac{\beta_{264}(VGS_{264} - VT)}{\beta_{302}(VGS_{302} - VT)} = \frac{\beta_{264}(VGS_{264} - VT)}{\beta_{302}(GAINADJ - INP + VGS_{264} - VT)}$$

Similarly, neglecting $VDS_{306}$ and $VDS_{308}$, $gm_{x0}\Gamma_{302}$ can be expressed as:

$$gm_{x0}\Gamma_{306} = \quad (7)$$

$$\frac{\beta_{264}(VGS_{264} - VT)}{\beta_{306}(VGS_{302} - VT)} = \frac{\beta_{264}(VGS_{264} - VT)}{\beta_{306}(GAINADJ - INP + VGS_{264} - VT)}$$

With $gm_y = gm_{x0}$, $\beta_{264}/\beta_{302} = 4$ and $\beta_{264}/\beta_{306} = 8$, equations (5), (6) and (7) can be used to express $gm_y/gm_x$ as:

$$\frac{gm_y}{gm_x} = 1 + (4\overline{G1} + 8\overline{G2})\frac{(VGS_{264} - VT)}{(GAINADJ - INP + VGS_{264} - VT)} \quad (8)$$

For nominal bias conditions and GAINADJ=5 volts, equation (8) can be simplified to:

$$\frac{gm_y}{gm_x} = 1 + 0.75 \cdot \overline{G1} + 1.50 \cdot \overline{G2} \quad (9)$$

Substituting equation (8) into equation (4) yields the amplifier nominal transfer characteristic:

$$WDATA = INP + (1 + 0.75\overline{G1} + 1.50\overline{G2})(2 \cdot DINP - (DINM0 + DINM1))(10)$$

As noted above, switching network 202 of FIGS. 12 and 13 may be used to set the DC removal amplifier 210 in any one of four modes. FIG. 15 is the table which summarizes the transfer characteristics of the circuitry in each of the four modes. In the DC removal modes of F1 and F2, low spatial frequency components of the photoreceiver output 192 of FIG. 11 are removed in effect by subtracting from a signal of interest the average of the signals received by a DC removal amplifier 210 from two or more photoreceivers. In the F1 mode, the signal of interest is the PHR(i) signal from line 192. This signal is received at the DINP(i) line 230 in FIG. 14. Since DINP(i) connects to both transistor 314 and transistor 316, PHR(i) is shown as being multiplied by two in the equation of the F1 mode. In this mode, the signal from PHR(i-2) is switched to both the DINM1(i) line 232 and the DINM0(i) line 234, so that PHR(i-2) is also multiplied by two. The difference value is multiplied by $gm_y/gm_x$, which is subtracted from the DCRCM value. Again, the DCRCM value is selected to establish a positive mid range voltage value for subsequent processing of the analog signal at WDATA(i) line 236.

In the F2 mode of FIG. 15, the signals at the INP(i) line 228, the DINP(i) line 230 and DINM0(i) line 234 remain the same, but the DINM1(i) line 232 is switched from connection with the PHR(i-2) output line 188 to the PHR(i+2) line 196. The filtering of common components occurs, but the commonality is with reference to three photoreceivers, rather than two. Photoreceiver PHR(i) controls transistors 314 and 316. Photoreceiver PHR(i-2) controls transistor 318, while photoreceiver PHR(i+2) controls transistor 320.

The number of transistors controlled by each photoreceiver, or the areas of such transistors, can be varied to vary the weighting of the different photoreceivers.

Figure 16:
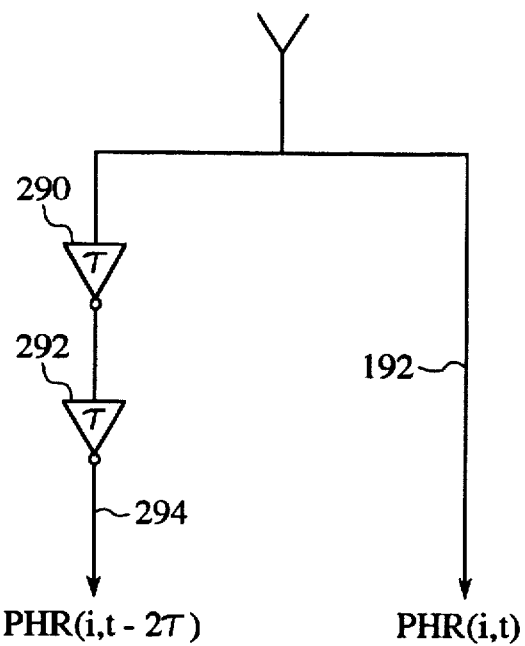
FIG. 16 is a schematic diagram of a circuit in which a photoreceiver output is delayed along only one of two parallel lines, so as to establish a signal relationship for subsequent two-dimensional DC removal.
Figure 17:
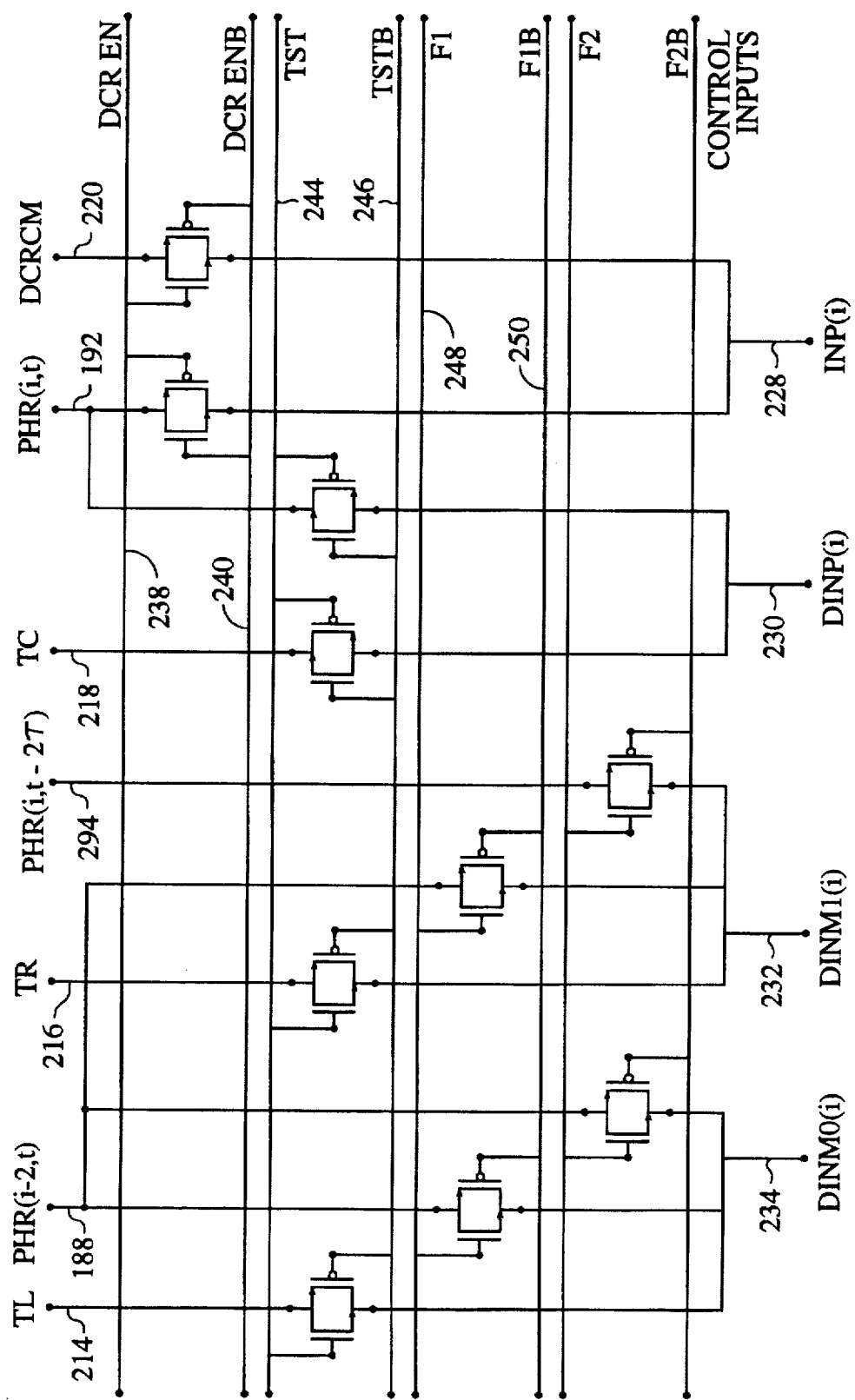
FIG. 17 is a schematic diagram of two-dimensional DC removal circuitry for connection to the circuit of FIG. 16.

The circuits of FIGS. 16 and 17 provide a modification of the F2 mode. In FIG. 16, the signal from a photoreceiver is conducted without delay to the line 192. This, the signal along 192 is in real time (t). A pair of delay circuits 290 and 292 is connected in series along a second line 294. The signal at the line 294 is the photoreceiver output with a delay of 2τ.

The delay circuits 290 and 292 along the second line 294 allow two-dimensional DC removal. That is, a secondary input for DC removal may be from a different row within the same column as the source of the primary input. The F2 mode then becomes:

$$WDATA =$$

$$DRCM - \frac{gm_y}{gm_x}[2 \cdot PHR(i, t) - PHR(i - t - 2\tau) + PHR(i - 2, t)]$$

The circuit of FIG. 17 is used to implement the F2 mode of operation. Common lines in FIGS. 12 and 17 are identified by identical reference numerals. The circuit of FIG. 17 remains the same with respect to the primary input at line 192 and one of the secondary inputs at line 188. However, the secondary input at line 294 is from the same transfer amplifier as the primary input at line 192. The input is from the same column, but the delay of 2τ results in the secondary input being from a different row. Preferably, the delay τ is equal to the sampling time of the transfer amplifiers.

The use of delay circuits 290 and 292 in FIG. 16 is not critical to the operation of the two-dimensional DC removal function. For example, the appropriate secondary inputs may be provided by sample-and-hold circuits that operate in a round robin fashion.

The circuits of FIGS. 12–14 and FIGS. 16 and 17 efficiently overcome the adverse effects of variations in illumination of a substrate that is viewed by a photoreceiver array. Moreover, in the use of the invention in providing navigation information, as set forth above, the navigation operation is less affected by such things as one portion of a navigation array viewing paper fibers of a shaded region of a scanned original, while the paper fibers viewed by a second portion of the array are outside of the shaded region of the original.

While not critical, the DC removal amplifier 210 of FIG. 14 includes offset correction to reduce voltage offsets, such as those generated by manufacturing-induced variations in device parameters. Transistors 322, 324, 326, 328, 330 and 332 are employed to implement offset correction. To perform an offset correction cycle, transistor 322 is switched "on" with the CAL input signal at line 226, thereby connecting the DC removal amplifier output WDATA(i) to an OFST_CTRL node 334. The negative feedback as shown by line 298 in FIG. 11 at the second differential cell 262 is disconnected by turning "off" transistor 284. The differential inputs to the cells 260 and 262 are shorted out by the shunt switch transistors 328, 330 and 332. With the inputs shorted, the DC removal amplifier 210 amplifies the input offset. Offset correction transistors 286, 288, 290 and 292 are biased in the triode region. If the voltage at OFST_CTRL node 334 is not equal to bias voltage VBP, current mirrors provided by transistors 268 and 270 and transistors 336 and 338 will be unbalanced and will create an additional voltage at the WDATA(i) output 236. With $A_{o1}$ being the open loop gain of the amplifier 210 from the conventional inputs, the amplifier is designated to have the following relationship between the OFST_CTRL node and the output 236:

$$WDATA(i) = \frac{A_{o1}}{100} (vbs - OFST\_CTRL) \tag{11}$$

With the amplifier output connected to the OFST_CTRL node via transistor 322, a new negative feedback path is introduced. Since the gain from the OFST_CTRL node to the amplifier output is approximately 100 times less than the gain from conventional input to output, the temporary negative feedback path created by means of transistor 322 causes a signal equal to 100 times the input offset to be developed between OFST_CTRL and the bias voltage VBP.

At the end of a calibration cycle, the CAL input is brought to logic low, so that the OFST_CTRL node 334 is disconnected from the WDATA(i) output 236. Transistor 324 is used as a capacitor approximately equal to 300 fF. The offset correction signal generated during the correction cycle is stored as charge at the gate of the transistor 324. If desired, offset correction may be disabled by driving the gate of transistor 326 low via line 340, thereby shunting the OFST_CTRL node 334 to the bias input VBP.

We claim:

1. Circuitry for transferring signals comprising:
   a plurality of signal generating circuits, each said circuit having an output;
   a plurality of DC removal means for removing spatial frequency components from said outputs of said circuits, each DC removal means being operatively associated with a particular circuit and having a primary input connected to receive a signal of interest from the output of said particular circuit, said each DC removal means including at least one secondary input connected to receive a signal output from one of said circuits proximal to said particular circuit, said each DC removal means having a difference means for providing an output signal responsive to analog signal differences between said signal of interest and said signal outputs received at said at least one secondary input.

2. The circuitry of claim 1 wherein each DC removal means includes a first differential cell having said primary input and said at least one secondary input, said first differential cell having an output node responsive to signal difference between said primary input and said at least one secondary input.

3. The circuitry of claim 2 wherein each DC removal means includes a second differential cell having a first input connected to said output node of said first differential cell and having a second input and a signal-out node, said second input being connected to said signal-out node by a negative feedback loop.

4. The circuitry of claim 3 wherein each second differential cell has a positive input selectively connected to a source of a generally fixed common mode signal.

5. The circuitry of claim 1 wherein said circuits are photoelements arranged to form a first row of photoelements, said particular circuit being a photoelement in said first row and being spaced apart from all photoelements connected to said at least one secondary input by an intermediate photoelement in said first row.

6. The circuitry of claim 5 wherein each DC removal means is operationally associated with a different photoelement in said first row.

7. The circuitry of claim 6 further comprising a plurality of second rows of photoelements arranged with said first row to define columns of photoelements, each one of said DC removal means being operatively associated with a different column of photoelements.

8. The circuitry of claim 1 wherein said circuits are photoelements arranged in rows and columns, each DC removal means being connected to receive a secondary input from a photoelement in a same row as a photoelement connected to said primary input and being connected to receive a secondary input from a photoelement in a same column as said photoelement connected to said primary input.

9. The circuitry of claim 1 wherein each DC removal means includes an offset correction circuit having a negative feedback loop and a sample-and-hold arrangement for storing an offset signal.

10. The circuitry of claim 1 further comprising a plurality of switching networks in a one-to-one correspondence with said plurality of DC removal means, each switching network having a plurality of switches for selectively varying connection of said primary and secondary inputs to different sources of signals, including different circuits of said plurality of signal generating circuits.

11. The circuitry of claim 1, wherein said DC removal means include means for weighting said signal output from said one of said circuits proximal to said particular circuit relative to said signal of interest from said output of said particular circuit.

* * * * *

UNITED STATES PATENT AND TRADEMARK OFFICE
CERTIFICATE OF CORRECTION

PATENT NO. : 5,703,353
DATED : December 30, 1997
INVENTOR(S) : Travis N. Blalock, et. al.

It is certified that error appears in the above-identified patent and that said Letters Patent is hereby corrected as shown below:

Column 8, line 40, "2reV" should read -- 2mV --;

Column 15, line 57, " $\dfrac{\beta_{264}(VGS_{264}-VT)}{\beta_{306}(VGS_{302}-VT)}$ " should read -- $\dfrac{\beta_{264}(VGS_{264}-VT)}{\beta_{306}(VGS_{306}-VT)}$ --.

Signed and Sealed this

Fifteenth Day of December, 1998

Attest:

BRUCE LEHMAN

*Attesting Officer*  *Commissioner of Patents and Trademarks*